US008212238B2

(12) United States Patent
Kato et al.

(10) Patent No.: US 8,212,238 B2
(45) Date of Patent: Jul. 3, 2012

(54) SEMICONDUCTOR DEVICE AND MANUFACTURING METHOD THEREOF

(75) Inventors: Kiyoshi Kato, Atsugi (JP); Toshihiko Saito, Atsugi (JP); Tamae Takano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 608 days.

(21) Appl. No.: 11/635,052

(22) Filed: Dec. 7, 2006

(65) Prior Publication Data

US 2007/0147104 A1 Jun. 28, 2007

(30) Foreign Application Priority Data

Dec. 27, 2005 (JP) ................. 2005-376626

(51) Int. Cl.
 *H01L 35/24* (2006.01)
 *H01L 51/00* (2006.01)
(52) U.S. Cl. ............... 257/40; 365/70; 257/295
(58) Field of Classification Search .......... 257/40, 257/295; 365/70
 See application file for complete search history.

(56) References Cited

U.S. PATENT DOCUMENTS

| 5,546,413 A * | 8/1996 | Lebby et al. ............. 372/6 |
| 5,771,022 A | 6/1998 | Vaughan et al. |
| 5,780,915 A * | 7/1998 | Lee ....................... 257/448 |
| 5,883,397 A | 3/1999 | Isoda et al. |
| 5,923,295 A | 7/1999 | Nakano et al. |
| 6,410,955 B1 * | 6/2002 | Baker et al. ............. 257/307 |
| 6,576,946 B1 * | 6/2003 | Kanai et al. ............. 257/306 |
| 6,635,508 B2 * | 10/2003 | Arai et al. ................. 438/99 |
| 6,638,830 B1 * | 10/2003 | Tsai et al. ................ 438/397 |
| 6,750,473 B2 * | 6/2004 | Amundson et al. ......... 257/40 |
| 6,979,620 B1 | 12/2005 | Wu et al. |
| 7,019,709 B2 | 3/2006 | Fukushima et al. |
| 7,253,433 B2 * | 8/2007 | Ishida et al. .............. 257/40 |
| 7,531,832 B2 * | 5/2009 | Tada et al. ................ 257/40 |
| 2005/0179031 A1 * | 8/2005 | Sampietro et al. .......... 257/40 |
| 2005/0201181 A1 * | 9/2005 | Ishikura ................. 365/226 |
| 2006/0214008 A1 | 9/2006 | Asami et al. |
| 2006/0220252 A1 | 10/2006 | Yukawa et al. |
| 2006/0246269 A1 | 11/2006 | Yukawa |
| 2006/0246643 A1 | 11/2006 | Ohsawa |

FOREIGN PATENT DOCUMENTS

JP 07-022669 1/1995

OTHER PUBLICATIONS

Chinese Office Action (Application No. 200610156237.4; CN09305) Dated Nov. 16, 2011.

* cited by examiner

*Primary Examiner* — Anthony Ho
(74) *Attorney, Agent, or Firm* — Eric J. Robinson; Robinson Intellectual Property Law Office, P.C.

(57) ABSTRACT

An object of the present invention to provide a semiconductor device having a highly functional memory element with improved reliability, and to provide a technique for manufacturing such a highly reliable semiconductor device with a high yield at low cost without complicating an apparatus or a process. As a top view shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

16 Claims, 20 Drawing Sheets

SEMICONDUCTOR DEVICE AND MANUFACTURING METHOD THEREOF

BACKGROUND OF THE INVENTION

1. Field of the Invention

The present invention relates to a semiconductor device having a memory element and a manufacturing method of the semiconductor device.

2. Description of the Related Art

Recently, an individual-recognition technique has attracted attention, in which information such as a history of an object is clarified for manufacturing, management, or the like by giving an ID (individual identification) number to each object. In particular, a semiconductor device capable of contactless data transmission and reception has been developed. As such a semiconductor device, an RFID (Radio Frequency Identification) tag (also referred to as an ID tag, an IC tag, an IC chip, an RF (Radio Frequency) tag, a wireless tag, an electronic tag, or a wireless chip) or the like specifically begins to be introduced into companies, markets, and the like.

Such a semiconductor device generally includes an antenna and a circuit (hereinafter, also referred to as an IC (Integrated Circuit) chip) using a semiconductor substrate of silicon (Si) or the like, and the IC chip includes a memory circuit (hereinafter also referred to as a memory), a control circuit, and the like. In addition, the development of a control circuit, a memory circuit, and the like is actively pursued, in which an organic thin film transistor (hereinafter also referred to as a TFT), an organic memory, and the like using an organic compound is included (see Patent Document 1: Japanese Published Patent Application No. H7-22669).

SUMMARY OF THE INVENTION

In a memory circuit using an organic compound, in which a memory element is formed by providing a pair of electrodes with an organic compound interposed therebetween, in the case where the organic compound layer is thick, current becomes difficult to flow and rise in a driving voltage becomes a problem; whereas in the case where the organic compound layer is thin, the memory circuit is easily affected by dust or irregularities on a surface of the electrode layers and a problem such as variations in properties of a memory (a writing voltage or the like), abnormal writing, or the like becomes a problem, depending on the size of the memory circuit.

Accordingly, it is an object of the present invention to provide a technique for manufacturing a highly reliable semiconductor device with a high yield without complicating an apparatus or a process.

In the present invention, a memory element including conductive layers serving as a pair of electrodes with an organic compound layer interposed therebetween is used. A shape of the memory element is determined by a stacked-layer structure including the first electrode layer, the organic compound layer, and the second electrode layer. Inventors manufacture 1024 memory elements in each of the following sizes: 2 μm×2 μm, 3 μm×3 μm, and 5 μm×5 μm, and apply writing voltage to each memory element to perform writing electrically. A writing failure rate among the memory elements having each size is calculated by dividing the number of memory elements which fails in writing by the total number (1024). In addition, the writing voltage is changed into 8 V, 9 V, 10 V, 11 V, and 12 V, and writing failure rates Pf(%) of each voltage value of the memory elements having each size are calculated. Relation between the writing voltage and the writing failure rate Pf of the memory elements having each size is shown in FIG. 15A. Note that the memory element has a stacked-layer structure including a first conductive layer, an insulating layer, an organic compound layer, and a second conductive layer. Here, a titanium film with a thickness of 100 nm is used as the first conductive layer, a calcium fluoride ($CaF_2$) film with a thickness of 1 nm is used as the insulating layer, a α-NPD film with a thickness of 10 nm is used as the organic compound layer, and an aluminum film with a thickness of 200 nm is used as the second conductive layer.

FIG. 15A shows the writing failure rate Pf of the memory elements to the writing voltage. In FIGS. 15A to 15C, rhombus dots, square dots, and triangle dots show the writing failure rates to the writing voltage of the memory elements with sizes of 2 μm×2 μm, 3 μm×3 μm, and 5 μm×5 μm, respectively.

In FIG. 15A, a tendency is shown that as the writing voltage rises, the writing failure rate decreases in every size of the memory elements. However, the degree of the decrease varies and the lines of the writing failure rates of the memory elements are not overlapped with one another.

Then, data of the memory elements with different sizes are normalized. The normalization is performed with respect to both a side length and an area. FIG. 15B is a graph in which data normalized with respect to a side length is replotted. FIG. 15C is a graph in which data normalized with respect to an area is replotted. A method of the normalization is described in detail below.

The side length of the memory element of 5 μm×5 μm corresponds to 5/3 of the side length of the memory element of 3 μm×3 μm. Thus, the perimeter of the memory element of 5 μm×5 μm corresponds to S/L of the perimeter of the memory element of square L on a side. Data of each size of the memory element is normalized with respect to its side length, and since the writing failure rate of the memory element is Pf, the writing failure rate normalized with respect to the side length becomes $Pf^{(5/L)}(\%)$ (hereinafter, also referred to as Pfd). The relation between the writing voltage (V) and the writing failure rate normalized with respect to the side length Pfd ($Pf^{(5/L)}(\%)$) of the memory elements having each size is shown in FIG. 15B.

In a similar manner, normalization of data of each memory element is performed with respect to the area. The area of the memory element of 5 μm×5 μm corresponds to $(5/3)^2$ of the area of the memory element of 3 μm×3 μm. Thus, the area of the memory element of 5 μm×5 μm corresponds to $(5 \mu L)^2$ of the area of the memory element of square L on a side. Each size of the memory element is normalized with respect to its area, and since the writing failure rate of the memory element is Pf, the writing failure rate normalized with respect to the area becomes Pf to the $(5/L)^2$ power(%) (hereinafter, also referred to as Pfs). The relations between the writing voltage (V) and the writing failure rate normalized with respect to the area Pfs (Pf to the $(5/L)^2$ power(%)) of the memory element with each size are shown in FIG. 15C.

The graph of FIG. 15B in which data of each memory element is normalized with respect to its side length shows similar writing failure rates Pfd among each of the memory elements with sizes of 2 μm×2 μm, 31 μm×3 μm, and 5 μm×5 μm. On the other hand, the graph of FIG. 15C in which data of each memory element is normalized with respect to its area shows, similarly to the data of FIG. 15A before the normalization, the degree of the decrease in the writing failure rate Pfs to the writing voltage varies and the lines of the writing failure rates Pfs to the writing voltage of each memory element are not overlapped with one another. Since data of the each memory element is less varied when the data is normalized with respect to the side length of the memory element having each size, it is understood that the writing failure rate of the memory element is greatly influenced by the perimeter rather than the area.

Therefore, the present invention provides shapes of memory elements having the same area and focuses attention to their perimeters. In the present invention, when a shape of the memory element B is changed into a rectangular (or a square) shape without changing the area, the ratio of its long side (b) to its short side (a) (X=b/a) is preferably high. In the present invention, the ratio (X) of the long side to the short side is preferably 3 or more, more preferably, 6 or more. A square memory element A having the same perimeter as that of the memory element B (dB=2a+2b) has a side length dA which satisfies dA=(a+b)/2 and an area SA which satisfies $SA=((a+b)/2)^2$. On the other hand, the area SB of the memory element B satisfies SB=ab. Therefore, when the ratio (X) of the long side to the short side is 3 or more, the ratio Y (Y=SB/SA) which is the ratio of the area SB of the memory element B to the area SA of the square memory element A is 0.75 or less. Further, when the ratio (X) of the long side to the short side is 6 or more, the ratio Y which is the ratio of the area SB of the memory element B to the area SA of the square memory element A is 0.5 or less.

Note that in this specification, a ratio of a long side to a short side of a rectangle having the same area and perimeter as the memory element refers to a value obtained by dividing the long side by the short side. Similarly, a ratio of an area of a memory element to an area of a square having the same perimeter refers to a value obtained by dividing the area of the memory element by the area of the square having the same perimeter as the memory element.

In the present invention, a memory element which includes conductive layers (a first conductive layer and a second conductive layer) serving as a pair of electrodes and an organic compound layer interposed therebetween is used as a memory element. Thus, the memory element is a stacked-layer region which includes at least the first conductive layer, the organic compound layer, and the second conductive layer. A shape of the memory element refers to a shape of the stacked-layer body. Therefore, the shape of the memory element can be controlled by each shape of the first conductive layer, the organic compound layer, and the second conductive layer. In addition, an insulating layer serving as a partition may be formed selectively over the first conductive layer, whereby a region where the organic compound layer is in contact with the first conductive layer can be selectively controlled.

In the present invention, as a shape of a memory element, a rectangular shape having a projection and a depression on the periphery, a zigzagged shape having one or plural bends, a comb shape, a annular shape having an opening (space) inside (a ring shape, a loop shape, or a so-called doughnut shape), or the like is used. Alternatively a rectangular (square) shape with a slit (cutout) may be used. Further alternatively, a rectangular shape with a ratio of a long side to a short side being high, an ellipse with a ratio of a long axis to a short axis being high, or the like can also be used.

Note that in this specification, a semiconductor device refers to a device which can function by utilizing semiconductor properties. A semiconductor device such as an integrated circuit having a memory element of the present invention and a chip having a processor circuit and a memory element of the present invention can be manufactured.

One aspect of a semiconductor device of the present invention includes a memory element which has a first conductive layer, a second conductive layer, and an organic compound layer interposed therebetween, in which at least one of the first conductive layer and the second conductive layer has a top view shape which is bent at least once.

One aspect of a semiconductor device of the present invention includes a memory element which has a first conductive layer, a second conductive layer, and an organic compound layer interposed therebetween, in which at least one of the first conductive layer and the second conductive layer has a top view comb-shape.

One aspect of a semiconductor device of the present invention includes a memory element which has a first conductive layer, a second conductive layer, and an organic compound layer interposed therebetween, in which at least one of the first conductive layer and the second conductive layer has a top view ring-shape.

One aspect of a semiconductor device of the present invention includes a memory element which has a first conductive layer, a second conductive layer, and an organic compound layer interposed therebetween, in which at least one of the first conductive layer and the second conductive layer has a top view shape with a slit.

One aspect of a semiconductor device of the present invention includes a memory element which has a first conductive layer, an insulating layer having an opening formed over the first conductive layer, an organic compound layer formed in the opening over the first conductive layer, and a second conductive layer formed over the organic compound layer; in which the opening has a top view shape which is bent at least once.

One aspect of a semiconductor device of the present invention includes a memory element which has a first conductive layer, an insulating layer having an opening formed over the first conductive layer, an organic compound layer formed in the opening over the first conductive layer, and a second conductive layer formed over the organic compound layer; in which the opening has a top view comb-shape.

One aspect of a semiconductor device of the present invention includes a memory element which has a first conductive layer, an insulating layer having an opening formed over the first conductive layer, an organic compound layer formed in the opening over the first conductive layer, and a second conductive layer formed over the organic compound layer; in which the opening has a top view ring-shape.

One aspect of a semiconductor device of the present invention includes a memory element which has a first conductive layer, an insulating layer having an opening formed over the first conductive layer, an organic compound layer formed in the opening over the first conductive layer, and a second conductive layer formed over the organic compound layer; in which the opening has a top view shape with a slit.

One aspect of a manufacturing method of a semiconductor device of the present invention includes forming a memory element having a shape which is bent at least once which is formed by forming a first conductive layer having a the top view shape which is bent at least once, forming an organic compound layer over the first conductive layer having the top view shape which is bent at least once, and forming a second conductive layer over the organic compound layer.

One aspect of a manufacturing method of a semiconductor device of the present invention includes forming a memory element having a comb-shape which is formed by forming a first conductive layer having the top view comb-shape, forming an organic compound layer over the first conductive layer having the top view comb-shape top surface, and forming a second conductive layer over the organic compound layer.

One aspect of a manufacturing method of a semiconductor device of the present invention includes forming a memory element having a ring-shape which is formed by forming a first conductive layer having the top view ring-shape, forming an organic compound layer over the first conductive layer having the top view ring-shape, and forming a second conductive layer over the organic compound layer.

One aspect of a manufacturing method of a semiconductor device of the present invention includes forming a memory element having a shape with a slit which is formed by forming a first conductive layer having the top view shape with the slit, forming an organic compound layer over the first conductive layer having the top view shape with the slit, and forming a second conductive layer over the organic compound layer.

One aspect of a manufacturing method of a semiconductor device of the present invention includes forming a memory element having a shape which is bent at least once which is formed by forming a first conductive layer, forming an insulating layer having an opening with the top view shape which is bent at least once over the first conductive layer, forming an organic compound layer in the opening with the top view shape which is bent at least once over the first conductive layer, and forming a second conductive layer over the organic compound layer.

One aspect of a manufacturing method of a semiconductor device of the present invention includes forming a memory element having a comb-shape which is formed by forming a first conductive layer, forming an insulating layer having an opening with the top view comb-shape over the first conductive layer, forming an organic compound layer in the opening with the top view comb-shape over the first conductive layer, and forming a second conductive layer over the organic compound layer.

One aspect of a manufacturing method of a semiconductor device of the present invention includes forming a memory element having a ring-shape, which is formed by forming a first conductive layer, forming an insulating layer having an opening with the top view ring-shape over the first conductive layer, forming an organic compound layer in the opening over the first conductive layer, and forming a second conductive layer over the organic compound layer.

One aspect of a manufacturing method of a semiconductor device of the present invention includes forming a memory element having a shape with a slit which is formed by forming a first conductive layer, forming an insulating layer having an opening with the top view shape with the slit over the first conductive layer, forming an organic compound layer in the opening over the first conductive layer, and forming a second conductive layer over the organic compound layer.

In the foregoing semiconductor device, after writing is performed to the semiconductor device, the first conductive layer and the second conductive layer may be partially brought into contact with each other, or a thickness of the organic compound layer may be changed.

According to the present invention, characteristics of memory elements are stabilized without variation, so that normal writing can be carried out. Therefore, a semiconductor device with improved reliability can be manufactured with a high yield without complicating an apparatus or a process.

DETAILED DESCRIPTION OF THE INVENTION

Figure 1A:
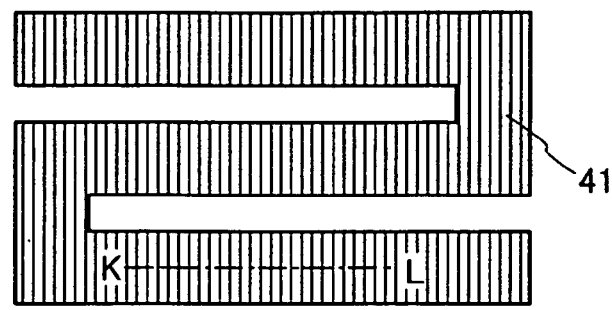
FIGS. 1A to 1D are views illustrating the present invention.

Hereinafter, the embodiment modes of the present invention is described with reference to the accompanying drawings. However, the present invention is not limited to the following description, and it is easily understood by those skilled in the art that modes and details herein disclosed can be modified in various ways without departing from the purpose and the scope of the present invention. Accordingly, the present invention should not be interpreted as being limited to the description of the embodiment modes to be given below. Note that like portions or portions having a similar function in the different drawings are commonly denoted by the like reference numerals when describing embodiment modes with reference to the drawings, and repeated explanations thereof are omitted.

Embodiment Mode 1

In this embodiment mode, a memory element to which the present invention is applied is described with reference to FIGS. 1A to 1D.

The present invention provides shapes of memory elements having the same area and focuses attention to their perimeters. First, a memory element B including a first conductive layer, an organic compound layer, and a second conductive layer is considered.

When a rectangle (or a square) having the same area as the memory element B whose area SB satisfies SB=ab has a short side a and a long side b, a perimeter dB of the rectangle satisfies dB=2a+2b. Considering a square memory element A having the same perimeter as that of the memory element B, a side length dA satisfies dA=(a+b)/2 and an area SA satisfies SA=((a+b)/2)².

Figure 9:
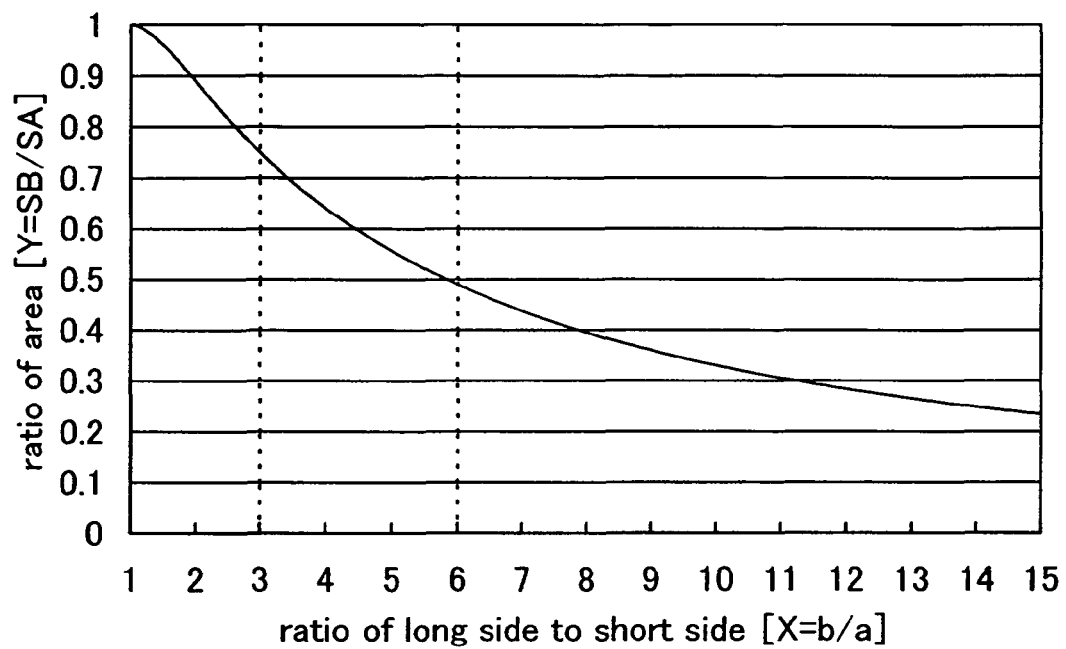
FIG. 9 is a graph showing a relation between an area and a ratio of a long side to a short side of a memory element.

The area of the memory element A and that of the memory element B are compared. The area of the memory element A, SA, satisfies SA=((a+b)/2)² and the area of the memory element B, SB, satisfies SB=ab. A ratio of SB which is the area of the memory element B to SA which is the area of the square memory element A, which is denoted by Y, satisfies Y=SB/SA=ab/((a+b)/2)². When a ratio of the long side b to the short side a of the memory element B, which is b/a. is denoted by X (X=b/a), Y=4x/(X+1)² is satisfied. The relation between the ratio X, which is the ratio of the long side b to the short side a of the memory element B, and the ratio Y, which is the ratio of the area of the memory element B to the area of the square memory element A is shown in FIG. 9. Note that the long side b>the short side a, therefore, the ratio X is 1 or more.

As shown in FIG. 9, the ratio Y, which is the ratio of the area of the memory element B to the area of the square memory element A having the same perimeter as that of the memory element B becomes lower as the ratio X, which is the ratio of the long side to the short side of the memory element B becomes higher. In the present invention, if a memory element has its shape changed into a rectangle (or square) without changing the area, the ratio X of the long side b to the short side a (X=b/a) is preferably high. In specific, the ratio (X) of the long side to the short side is preferably 3 or more, more preferably, 6 or more. Therefore, when the ratio (X) of the long side to the short side is 3 or more, the ratio Y which is the ratio of the area SB of the memory element B to the area SA of the square memory element A is 0.75 or less. Further, when the ratio (X) of the long side to the short side is 6 or more, the ratio Y which is the ratio of the area SB of the memory element B to the area SA of the square memory element is 0.5 or less.

In the present invention, a memory element which includes conductive layers (a first conductive layer and a second conductive layer) serving as a pair of electrodes and an organic compound layer interposed therebetween is used as a memory element. Thus, the memory element is a stacked-layer region which includes at least the first conductive layer, the organic compound layer, and the second conductive layer. A shape of the memory element refers to a shape of the stacked-layer body. Therefore, the shape of the memory element can be controlled by each shape of the first conductive layer, the organic compound layer, and the second conductive layer. For example, in order to form the memory element having a shape such as described above, the first conductive layer is formed into a desired shape, and then, the organic compound layer and the second conductive layer are stacked over the first conductive layer formed into the desired shape, whereby the memory element reflecting the shape of the first conductive layer is formed. In addition, an insulating layer serving as a partition may be formed selectively over the first conductive layer, whereby a region where the organic compound is in contact with the first conductive layer can be selectively controlled.

In the present invention, as a shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

Figure 1B:
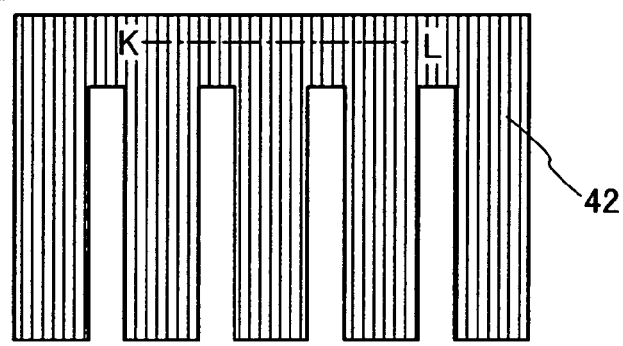
Figure 1C:
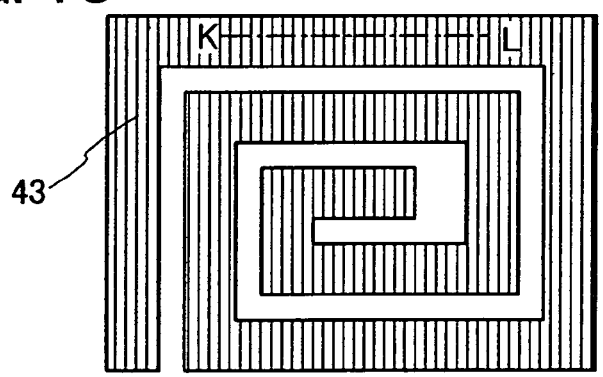
Figure 1D:
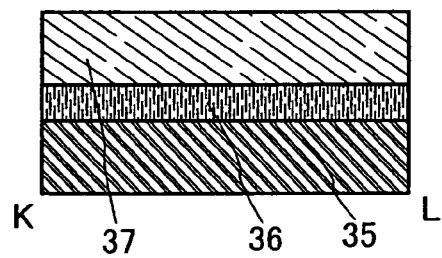

A cross-sectional view and top views of the memory elements of this embodiment mode are shown in FIGS. 1A to 1D and 18A to 18C. FIGS. 1A to 1C and 18A to 18C are top views of the memory elements and show examples of memory elements having different shapes. FIG. 1D is a cross-sectional view along a line K-L in each of FIGS. 1A to 1C and 18A to 18C. As shown in FIG. 1D, the memory element of this embodiment mode has a stacked-layer structure including a first conductive layer 35, an organic compound layer 36, and a second conductive layer 37. The memory elements shown in FIGS. 1A to 1C and 18A to 18C are regions which include stacked layers of the first conductive layer, the organic compound layer, and the second conductive layer.

A top view shape of a memory element 41 of FIG. 1A is bent to have a square-wave form and it meanders from side to side. Although the top view shape of the memory element 41 is angulated at a bend, the bend may have a rounded shape with curvature. In addition, one or a plurality of bends is provided. A memory element 42 of FIG. 1B includes a comb-shaped conductive layer and has a plurality of depressions on one side of a rectangle. The depression may be one or plural. In FIG. 1B, the depression is provided only on one side, and the memory element is comb-shaped; however, the depression may be provided on another side. If the depression is also provided on a side which is parallel and opposed to the side having the depression in FIG. 1B, a bone shaped conductive layer can be formed. A memory element 43 of FIG. 1C is a conductive layer which bends to make a spiral to the center (a so-called spiral shape). Although the memory element 43 of FIG. 1C has angulated bends, the bent portion may have a rounded shape with curvature. In addition, a projection and a depression provided on the periphery shown in FIG. 1B may be provided to the memory element 43.

Figure 18A:
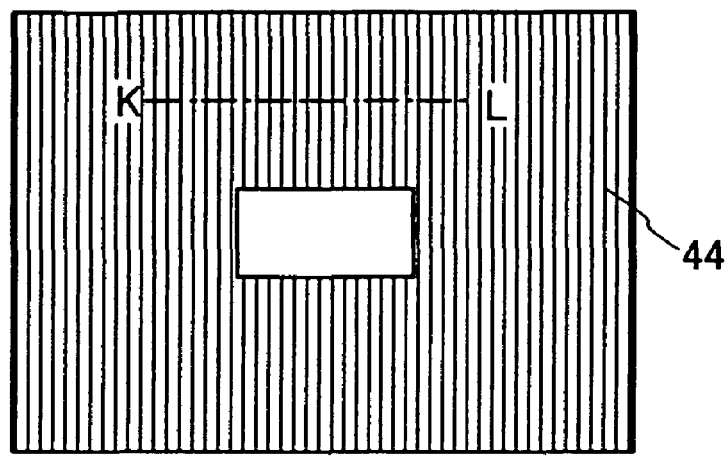
FIGS. 18A to 18C are views illustrating the present invention.
Figure 18B:
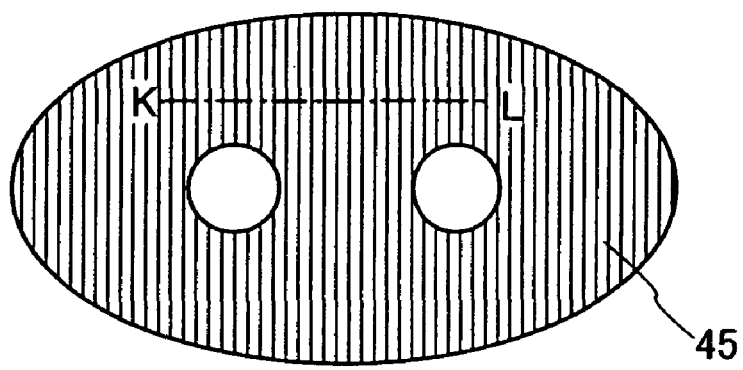
Figure 18C:
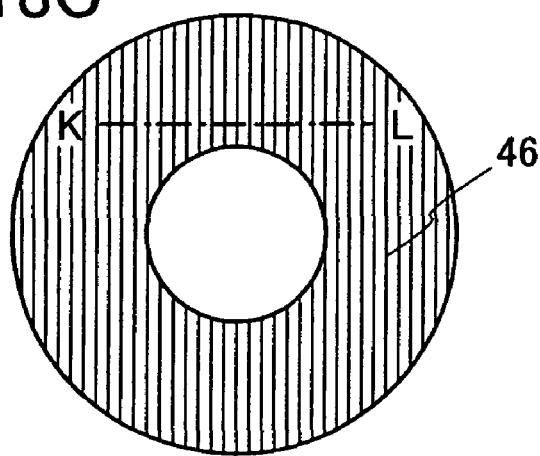

A memory element 44 of FIG. 18A has a rectangular shape including a similar rectangular space in the central portion of the memory element 44. A memory element 45 of FIG. 18B has an elliptical shape including two circular spaces near the center. A memory element 46 of FIG. 18C has a circular shape including a circular space, that is, a ring-shape. In FIGS. 18A to 18C, each of the spaces in the memory elements refers to an area where at least one of the first conductive layer, the organic compound layer, and the second conductive layer is not formed and a stack of layers in the memory element is not formed. Therefore, in FIGS. 18A to 18C, the spaces in the memory elements do not refer to an area where nothing is formed, but an area where the memory element is not formed.

A memory element having a shape such as those shown in FIGS. 1A to 1C and 18A to 18C is manufactured to have a bend or a projection and a depression; therefore, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

Figure 16A:
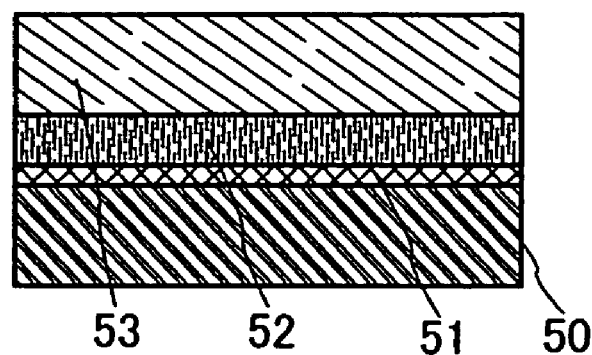
FIGS. 16A to 16C are views illustrating a memory element of the present invention.
Figure 16B:
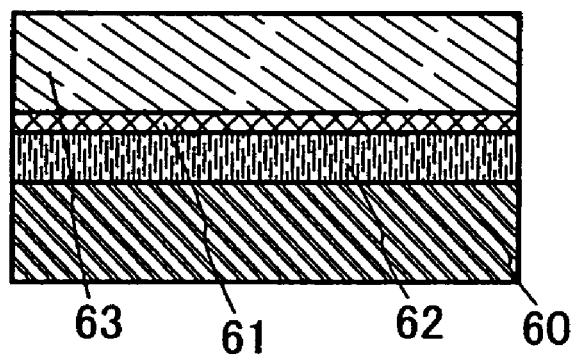
Figure 16C:
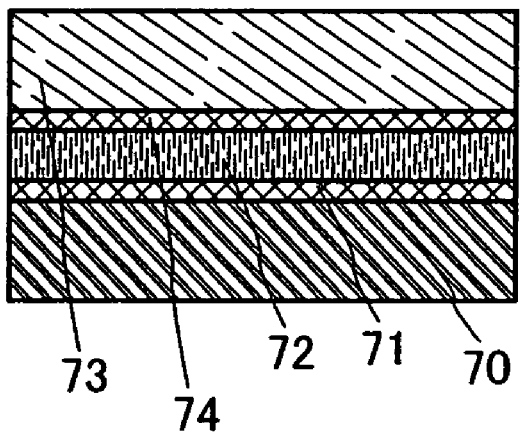

In addition, as shown in FIGS. 16A to 16C, an insulating layer may be formed between the organic compound layer and the conductive layer.

An organic compound layer 52, an organic compound layer 62, and an organic compound layer 72 may be formed of a similar material and in a similar manner to the organic compound layer 36 in FIGS. 1A to 1D.

FIG. 16A shows an example where an insulating layer 51 is formed between a first conductive layer 50 and an organic compound layer 52, and a second conductive layer 53 is formed over the organic compound layer 52. FIG. 16B shows an example where an organic compound layer 62 is formed over a first conductive layer 60, an insulating layer 61 is formed over the organic compound layer 62, and a second conductive layer 63 is formed over the insulating layer 61. FIG. 16C shows stacked layers including a first conductive layer 70, a first insulating layer 71, an organic compound layer 72, a second insulating layer 74, and a second conductive layer 73. The first insulating layer 71 is interposed between the first conductive layer 70 and the organic compound layer 72 and the second insulating layer 74 is formed between the organic compound layer 72 and the second conductive layer 73.

In this embodiment mode, the insulating layer 51, the insulating layer 61, the first insulating layer 71, and the second insulating layer 74 are insulating and may be very thin films (a thickness thereof is 4 nm or less, preferably, 0.1 nm or more and 2 nm or less) and depending on a material and a manufacturing method thereof, the insulating layers do not always have a shape as a continuous film but may have a discontinuous island shape. In other drawings in this specification, although the insulating layer is shown as a continuous layer, the insulating layer may also have a discontinuous island-shape.

The insulating layer which is formed at an interface between the conductive layer and the organic compound layer enables the tunnel injection of carriers; therefore, a tunnel current is considered to be flow. When voltage is applied between the first and second conductive layers, current flows to the organic compound layer and heat is generated. When the temperature of the organic compound layer rises to its glass-transition temperature, the material for forming the organic compound layer turns into a fluid composition. The fluid composition flows (moves) without maintaining the shape in a solid state, and changes the shape. Consequently, the thickness of the organic compound layer becomes uneven and the organic compound layer is transformed, and the first and second conductive layers are partially brought into contact with each other, and short-circuited. Alternatively, the first and the second conductive layers may be short-circuited due to a high electrical field effect because an electrical field is concentrated in a region where the organic compound layer is thin. As a result, the conductivity of the memory element is different between before and after voltage application.

In a semiconductor device, the first and second conductive layers may be partially brought into contact with each other or the thickness of the organic compound layer may be changed after writing is performed to the semiconductor device.

By providing the insulating layer 51, the insulating layer 61, the first insulating layer 71, and the second insulating layer 74, characteristics of the memory elements such as writing voltage are stabilized without variation; therefore, normal writing to each element can be carried out. Further, since a carrier injecting property is improved by providing the insulating layer, the thickness of the organic compound layer can be increased. Accordingly, a defect that the memory element is short-circuited in an initial state before electrical conduction can be prevented.

In the present invention, the insulating layer is formed by using an inorganic insulator or an organic compound, which are stable thermally and chemically and to which carriers are not injected. Examples of an inorganic insulator and an organic compound which can be used for the insulating layer are described below In the present invention, as an inorganic insulator which can be used for the insulating layer, oxide can be used, such as lithium oxide ($Li_2O$), sodium oxide ($Na_2O$), potassium oxide ($K_2O$), rubidium oxide ($Rb_2O$), beryllium oxide (BeO), magnesium oxide (MgO), calcium oxide (CaO), strontium oxide (SrO), barium oxide (BaO), scandium oxide ($Sc_2O_3$), zirconium oxide ($ZrO_2$), hafnium oxide ($HfO_2$), rutherfordium oxide ($RfO_2$), tantalum oxide (TaO), technetium oxide (TcO), iron oxide ($Fe_2O_3$), cobalt oxide (CoO), palladium oxide (PdO), silver oxide ($Ag_2O$), aluminum oxide ($Al_2O_3$), gallium oxide ($Ga_2O_3$), or bismuth oxide ($Bi_2O_3$).

In the present invention, as another inorganic insulator which can be used for the insulating layer, fluoride can be used, such as lithium fluoride (LiF), sodium fluoride (NaF), potassium fluoride (KF), rubidium fluoride (RbF), cesium fluoride (CsF), beryllium fluoride ($BeF_2$), magnesium fluoride ($MgF_2$), calcium fluoride ($CaF_2$), strontium fluoride ($SrF_2$), barium fluoride ($BaF_2$), aluminum fluoride ($AlF_3$), nitrogen trifluoride ($NF_3$), sulfur hexafluoride ($SF_6$), silver fluoride (AgF), or manganese fluoride ($MnF_3$).

In the present invention, as another inorganic insulator which can be used for the insulating layer, chloride can be used, such as lithium chloride (LiCl), sodium chloride (NaCl), potassium chloride (KCl), beryllium chloride ($BeCl_2$), calcium chloride ($CaCl_2$), barium chloride ($BaCl_2$), aluminum chloride ($AlC_3$), silicon chloride ($SiCl_4$), germanium chloride ($GeCl_4$), tin chloride ($SnCl_4$), silver chloride (AgCl), zinc chloride (ZnCl), titanium tetrachloride ($TiCl_4$), titanium trichloride ($TiCl_3$), zirconium chloride ($ZrCl_4$), iron chloride ($FeCl_3$), palladium chloride ($PdCl_2$), antimony trichloride ($SbCl_3$), antimony dichloride ($SbCl_2$), strontium chloride ($SrCl_2$), thallium chloride (TlCl), copper chloride (CuCl), manganese chloride ($MnCl_2$), or ruthenium chloride ($RuCl_2$).

In the present invention, as another inorganic insulator which can be used for the insulating layer, bromide can be used, such as potassium bromide (KBr), cesium bromide (CsBr), silver bromide (AgBr), barium bromide ($BaBr_2$), silicon bromide ($SiBr_4$), or lithium bromide (LiBr).

In the present invention, as another inorganic insulator which can be used for the insulating layer, iodide can be used, such as sodium iodide (NaI), potassium iodide (KI), barium iodide ($BaI_2$), thallium iodide (TlI), silver iodide (AgI), titanium iodide ($TiI_4$), calcium iodide ($CaI_2$), silicon iodide ($SiI_4$), or cesium iodide (CsI).

In the present invention, as another inorganic insulator which can be used for the insulating layer, carbonate can be used, such as lithium carbonate ($Li_2CO_3$), potassium carbonate ($K_2CO_3$), sodium carbonate ($Na_2CO_3$), magnesium carbonate ($MgCO_3$), calcium carbonate ($CaCO_3$), strontium carbonate ($SrCO_3$), barium carbonate ($BaCO_3$), manganese carbonate ($MnCO_3$), iron carbonate ($FeCO_3$), cobalt carbonate ($CoCO_3$), nickel carbonate ($NiCO_3$), copper carbonate ($CuCO_3$), silver carbonate ($Ag_2CO_3$), or zinc carbonate ($ZnCO_3$).

In the present invention, as another inorganic insulator which can be used for the insulating layer, sulfate can be used, such as lithium sulfate ($Li_2SO_4$), potassium sulfate ($K_2SO_4$), sodium sulfate ($Na_2SO_4$), magnesium sulfate ($MgSO_4$), calcium sulfate ($CaSO_4$), strontium sulfate ($SrSO_4$), barium sulfate ($BaSO_4$), titanium sulfate ($Ti_2(SO_4)_3$), zirconium sulfate ($Zr(SO_4)_2$), manganese sulfate ($MnSO_4$), iron sulfate ($FeSO_4$), ferric sulfate ($Fe_2(SO_4)_3$), cobalt sulfate ($CoSO_4$), cobalt sulfate (CO$_2$(SO$_4$)$_3$), nickel sulfate (NiSO$_4$), copper sulfate (CuSO$_4$), silver sulfate (Ag$_2$SO$_4$), zinc sulfate (ZnSO$_4$), aluminium sulfate (Al$_2$(SO$_4$)$_3$), indium sulfate (In$_2$(SO$_4$)$_3$), tin sulfate (SnSO$_4$), tin sulfate (Sn(SO$_4$)$_2$), antimony sulfate (Sb$_2$(SO$_4$)$_3$), or bismuth sulfate (Bi$_2$(SO$_4$)$_3$).

In the present invention, as another inorganic insulator which can be used for the insulating layer, nitrate can be used, such as lithium nitrate (LiNO$_3$), potassium nitrate (KNO$_3$), sodium nitrate (NaNO$_3$), magnesium nitrate (Mg(NO$_3$)$_2$), calcium nitrate (Ca(NO$_3$)$_2$), strontium nitrate (Sr(NO$_3$)$_2$) barium nitrate (Ba(NO$_3$)$_2$), titanium nitrate (Ti(NO$_3$)$_4$), zirconium nitrate (Zr(NO$_3$)$_4$), manganese nitrate (Mn(NO$_3$)$_2$), iron nitrate (Fe(NO$_3$)$_2$), iron nitrate (Fe(NO$_3$)$_3$), cobalt nitrate (Co(NO$_3$)$_2$), nickel nitrate (Ni(NO$_3$)$_2$), copper nitrate (Cu(NO$_3$)$_2$), silver nitrate (AgNO$_3$), zinc nitrate (Zn(NO$_3$)$_2$), aluminum nitrate (Al(NO$_3$)$_3$), indium nitrate (In(NO$_3$)$_3$), tin nitrate (Sn(NO$_3$)$_2$), or bismuth nitrate (Bi(NO$_3$)$_3$).

In the present invention, as another inorganic insulator which can be used for the insulating layer, nitride such as aluminum nitride (AlN) or silicon nitride (SiN), or carboxylate such as lithium carboxylate (LiCOOCH$_3$), potassium acetate (KCOOCH$_3$), sodium acetate (NaCOOCH$_3$), magnesium acetate (Mg(COOCH$_3$)$_2$), calcium acetate (Ca(COOCH$_3$)$_2$), strontium acetate (Sr(COOCH$_3$)$_2$), or barium acetate (Ba(COOCH$_3$)$_2$) can be used.

In the present invention, one or a plurality of the foregoing inorganic insulators can be used for the insulating layer.

In the present invention, as an organic compound which can be used for the insulating layer, polyimide, acrylic, polyamide, benzocyclobutene, polyester, novolac resin, melamine resin, phenol resin, epoxy resin, silicon resin, furan resin, diallyl phthalate resin, siloxane resin, or the like can be used.

As another organic compound material which can be used for the insulating layer of the present invention, the following or the like can be given: an aromatic amine compound (in other words, having a benzene ring-nitrogen bond) such as 4,4'-bis[N-(1-naphthyl)-N-phenyl-amino]-biphenyl (abbreviated as α-NPD), 4,4'-bis[N-(3-methylphenyl)-N-phenyl-amino]-biphenyl (abbreviated as TPD); 4,4',4"-tris(N,N-diphenyl-amino)-triphenylamine (abbreviated as TDATA): 4,4',4"-tris[N-(3-methylphenyl)-N-phenyl-amino]-triphenylamine (abbreviated as MTDATA); or 4,4'-bis(N-(4-(N,N-di-m-tolylamino)phenyl)-N-phenylamino)biphenyl (abbreviated as DNTPD); or a phthalocyanine compound such as phthalocyanine (abbreviated as H$_2$Pc), copper phthalocyanine (abbreviated as CuPc), or vanadyl phthalocyanine (abbreviated as VOPc); 2Me-TPD, FTPD, TPAC, OTPAC, Diamine, PDA, triphenylmethane (abbreviated as TPM), or STB.

In the present invention, as the organic compound material which can be used for the insulating layer, a material formed of a metal complex having a quinoline skeleton or a benzoquinoline skeleton such as tris(8-quinolinolato)aluminum (abbreviated as Alq$_3$), tris(4-methyl-8-quinolinolato)aluminum (abbreviated as Almq$_3$), bis(10-hydroxybenzo[h]quinolinato)beryllium (abbreviated as BeBq$_2$), bis(2-methyl-8-quinolinolato)-4-phenylphenolato-aluminum (abbreviated as BAlq), or the like can be used. Further, a material such as a metal complex having an oxazole based or thiazole based ligand such as bis[2-(2-hydroxyphenyl)benzoxazolato]zinc (abbreviated as Zn(BOX)$_2$) and bis[2-(2-hydroxyphenyl)benzothiazolato]zinc (abbreviated as Zn(BTZ)$_2$) can be used. Alternatively, the following or the like can be used: 2-(4-biphenylyl)-5-(4-tert-buthylphenyl)-1,3,4-oxadiazole (abbreviated as PBD), 1,3-bis[5-(p-tert-buthylphenyl)-1,3,4-oxadiazol-2-yl]benzene (abbreviated as OXD-7), 3-(4-tert-butylphenyl)-4-phenyl-5-(4-biphenylyl)-1,2,4-triazole (abbreviated as TAZ), 3-(4-tert-butylphenyl)-4-(4-ethylphenyl)-5-(4-biphenylyl)-1,2,4-triazole (abbreviated as p-EtTAZ), bathophenanthroline (abbreviated as BPhen), bathocuproin (abbreviated as BCP), 5,6,11,12-tetraphenyltetracene (abbreviated as rubrene), hexaphenylbenzene, t-butylperylene, 9,10-di(phenyl)anthracene, coumarin 545T, dendrimer, 4-dicyanomethylene-2-methyl-6-[2-(1,1,7,7-tetramethyl-9julolidyl)ethenyl]-4H-pyran (abbreviated as DCJT), 4-(dicyanomethylene)-2-t-butyl-6-[2-(1,1,7,7-tetramethyl-julolidin-9-yl)ethenyl]-4H-pyran (abbreviated as DCJTB), periflanthene, 2,5-dicyano-1,4-bis-[2-(10-methoxy-1,1,7,7-tetramethyljulolidin-9-yl)ethenyl]benzene, N,N'-dimethylquinacridone (abbreviated as DMQD), coumarin 6, 9,9'-bianthryl, 9,10-diphenylanthracene (abbreviated as DPA), 9,10-bis(2-naphthyl)anthracene (abbreviated as DNA), 2,5,8, 11-tetra-t-butylperylene (abbreviated as TBP), BMD, BDD, 2,5-bis(1-naphthyl)-1,3,4-oxadiazole (abbreviated as BND), BAPD, BBOT, TPQ1, TPQ2, or MBDQ.

In the present invention, as another organic compound which can be used for the insulating layer, a polyacetylene based material, a polyparaphenylene-vinylene based material, a polythiophene based material, a polyaniline based material, or a polyphenylene ethynylene based material, or the like can be used. Polyparaphenylen-vinylene based material includes a derivative of poly(paraphenylen-vinylene) [PPV], such as poly(2,5-dialkoxy-1,4-phenylene vinylene) [RO—PPV], poly(2-(2'-ethyl-hexoxy)-5-methoxy-1,4-phenylene-vinylene) [MEH-PPV], poly(2-(dialkoxyphenyl)-1, 4-phenylene vinylene) [ROPh-PPV], and like. Polyparaphenylen based material includes a derivative of polyparaphenylen [PPP], such as poly(2,5-dialkoxy-1,4-phenylene) [RO-PPP], poly(2,5-dihexoxy-1,4-phenylene), and the like. Polythiophene based material includes a derivative of polythiophene [PT], such as poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2'bithiophene] [PTOPT], and the like. Polyfluorene based material includes a derivative of polyfluorene [PF], such as poly(9,9-dialkylfluorene) [PDAF], poly(9,9-dioctylfluorene) [PDOF], and the like.

In the present invention, as another organic compound that can be used for the insulating layer, the following can be used: PFBT, a carbazole derivative, anthracene, coronene, peryrene, PPCP, BPPC, Boryl Anthracene, DCM, QD, Eu(TTA)$_3$phen, or the like.

In the present invention, one or plural kinds of the foregoing organic compounds can be used as an organic compound for the insulating layer.

In the present invention, one or plural kinds of the foregoing inorganic insulators and organic compounds can be used for forming the insulating layer. The insulating layer has an insulating property in the present invention.

The insulating layer can be formed by an evaporation method such as co-evaporation, a coating method such as spin-coating, or a sol-gel method. Further, the following can also be used: a droplet discharge (ejection) method (also referred to as an ink-jet method, depending on its manner) capable of forming a predetermined pattern by selectively discharging (ejecting) liquid droplets of a compound mixed for a specific purpose, a method capable of transferring or drawing an object with a desired pattern, that is for example, any printing method (a method of forming a desired pattern, such as screen (permeographic) printing, offset (lithography) printing, relief printing, or gravure (intaglio) printing), or the like.

A conductive layer used for the first conductive layer 35, the first conductive layer 50, the first conductive layer 60, the first conductive layer 70, the second conductive layer 37, the second conductive layer 53, the second conductive layer 63, and the second conductive layer 73 is formed of an element or a compound with high conductivity. Typically, a single-layer or a stacked-layer structure formed of one kind of the following elements or an alloy containing a plurality of the following elements can be employed: gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), or the like. As an alloy containing a plurality of the foregoing elements, an alloy containing Al and Ti, an alloy containing, Ti and C, an alloy containing Al and Ni, an alloy containing Al and C, an alloy containing Al, Ni, and C, an alloy containing Al and Mo, or the like can be used.

Alternatively, the first conductive layer 35, the first conductive layer 50, the first conductive layer 60, the first conductive layer 70, the second conductive layer 37, the second conductive layer 53, the second conductive layer 63, and the second conductive layer 73 are formed of one or a plurality of indium (In), tin (Sn), lead (Pb), bismuth (Bi), calcium (Ca), antimony (Sb), or zinc (Zn). Further alternatively, one or a plurality of magnesium (Mg), manganese (Mn), cadmium (Cd), thallium (Tl), tellurium (Te), or barium (Ba) may be used. A plurality of the foregoing metal materials may be contained or an alloy containing one or a plurality of the foregoing materials may be used. As an alloy which can be used, an indium alloy such as an indium-tin alloy (InSn), a magnesium-indium alloy (InMg), an indium-phosphorus alloy (InP), an indium-arsenic alloy (InAs), indium-chromium alloy (InCr), and the like can be given.

A light-transmitting material having light-transmitting property to visible light can also be used for the first conductive layer 35, the first conductive layer 50, the first conductive layer 60, the first conductive layer 70, the second conductive layer 37, the second conductive layer 53, the second conductive layer 63, and the second conductive layer 73. As a light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), gallium (Ga) doped ZnO, tin oxide ($SnO_2$), indium oxide containing tungsten oxide, indium zinc oxide containing tungsten oxide, indium oxide containing titanic oxide, indium tin oxide containing titanic oxide, or the like may be used as well.

The organic compound layer 36, the organic compound layer 52, the organic compound layer 62, and the organic compound layer 72 are formed of an organic compound whose conductivity is changed by optical action or electrical action. The organic compound layer 36, the organic compound layer 52, the organic compound layer 62, and the organic compound layer 72 may be formed by a single layer or stacking a plurality of layers.

As an organic compound for forming the organic compound layer 36, the organic compound layer 52, the organic compound layer 62, and the organic compound layer 72, an organic resin typified by polyimide, acrylic, polyamide, benzocyclobutene, epoxy, or the like can be used.

In addition, as the organic compound whose conductivity is changed by optical action or electrical action, for forming the organic compound layer 36, the organic compound layer 52, the organic compound layer 62, and the organic compound layer 72, an organic compound material having a hole-transporting property or an organic compound material having an electron-transporting property can be used.

As an organic compound material which has a hole-transporting property, the following or the like can be used: an aromatic amine compound (in other words, having a benzene ring-nitrogen bond) such as 4,4'-bis[N-(1-naphthyl)-N-phenyl-amino]-biphenyl (abbreviated as α-NPD), 4,4'-bis[N-(3-methylphenyl)-N-phenyl-amino]-biphenyl (abbreviated as TPD), 4,4',4''-tris(N,N-diphenyl-amino)-triphenylamine (abbreviated as TDATA), 4,4',4''-tris[N-(3-methylphenyl)-N-phenyl-amino]-triphenylamine (abbreviated as MTDATA), or 4,4'-bis(N-(4-(N,N-di-m-tolylamino)phenyl)-N-phenylamino)biphenyl (abbreviated as DNTPD); or a phthalocyanine compound such as phthalocyanine (abbreviated as $H_2Pc$), copper phthalocyanine (abbreviated as CuPc), or vanadyl phthalocyanine (abbreviated as VOPc). The substances described above are mainly substances having a hole mobility of $10^{-6}$ $cm^2/Vs$ or more.

As an organic compound material which has an electron-transporting property, a material formed of a metal complex having a quinoline skeleton or a benzoquinoline skeleton or the like can be used, such as tris(8-quinolinolato)aluminum (abbreviated as $Alq_3$), tris(4-methyl-8-quinolinolato)aluminum (abbreviated as $Almq_3$), bis(10-hydroxybenzo[h]quinolinato)beryllium (abbreviated as $BeBq_2$), or bis(2-methyl-8-quinolinolato)-4-phenylphenolato-aluminum (abbreviated as BAlq). Further, a material such as a metal complex having an oxazole based or thiazole based ligand such as bis[2-(2-hydroxyphenyl)benzoxazolato]zinc (abbreviated as $Zn(BOX)_2$), or bis[2-(2-hydroxyphenyl)benzothiazolato]zinc (abbreviated as $Zn(BTZ)_2$) can be used. Alternatively, the following or the like can be used as well as a metal complex: 2-(4-biphenylyl)-5-(4-tert-buthylphenyl)-1,3,4-oxadiazole (abbreviated as PBD), 1,3-bis[5-(p-tert-buthylphenyl)-1,3,4-oxadiazol-2-yl]benzene (abbreviated as OXD-7), 3-(4-tert-butylphenyl)-4-phenyl-5-(4-biphenylyl)-1,2,4-triazole (abbreviated as TAZ), 3-(4-tert-butylphenyl)-4-(4-ethylphenyl)-5-(4-biphenylyl)-1,2,4-triazole (abbreviated as p-EtTAZ), or bathophenanthroline (abbreviated as BPhen), bathocuproin (abbreviated as BCP). The substances described above are mainly substances having an electron mobility of $10^{-6}$ $cm^2/Vs$ or more.

The organic compound layer 36, the organic compound layer 52, the organic compound layer 62, and the organic compound layer 72 can be formed by an evaporation method, an electron-beam evaporation method, a sputtering method, a CVD method, or the like. If the organic compound layer is formed by using a plurality of materials, the materials can be deposited at the same time by combining methods of the same kind or different kinds, such as co-evaporation by resistance-heating evaporation, co-evaporation by electron-beam evaporation, co-evaporation by using both resistance-heating evaporation and electron-beam evaporation, deposition by both using resistance-heating evaporation and sputtering, or deposition by electron-beam evaporation and sputtering.

Further, each of the organic compound layer 36, the organic compound layer 52, the organic compound layer 62, and the organic compound layer 72 is formed to have a thickness with which the conductivity of the memory element is changed by optical action or electrical action. The memory element having the foregoing structure changes the conductivity between before and after voltage application and can store two values corresponding to an "initial state" and "after change of conductivity".

As voltage that is applied to the memory element of the present invention, a voltage applied to the first conductive layer may be higher than that of the second conductive layer;

alternatively, voltage that is applied to the second conductive layer may be higher than that of the first conductive layer. In the case where the memory element has a rectifying property, a potential difference may be provided between the first conductive layer and the second conductive layer so that voltage is applied in the forward-bias direction or the reverse-bias direction.

According to the present invention, characteristics of memory elements are stabilized without variation, so that normal writing can be carried out. Therefore, a semiconductor device with improved reliability can be manufactured with a high yield without complicating an apparatus or a process.

Embodiment Mode 2

In this embodiment mode, one structural example of the memory element included in a semiconductor device of the present invention is described with reference to drawings. In particular, a case where the semiconductor device is a passive matrix type is described.

A memory element of the present invention and an operation mechanism thereof are described with reference to FIGS. 2A to 2C, 3A to 3C, and 6A and 6B. The memory element in this embodiment mode can be manufactured by the same material and with the same structure as those in Embodiment Mode 1, and therefore, detailed description of the material and the like is omitted.

Figure 3A:
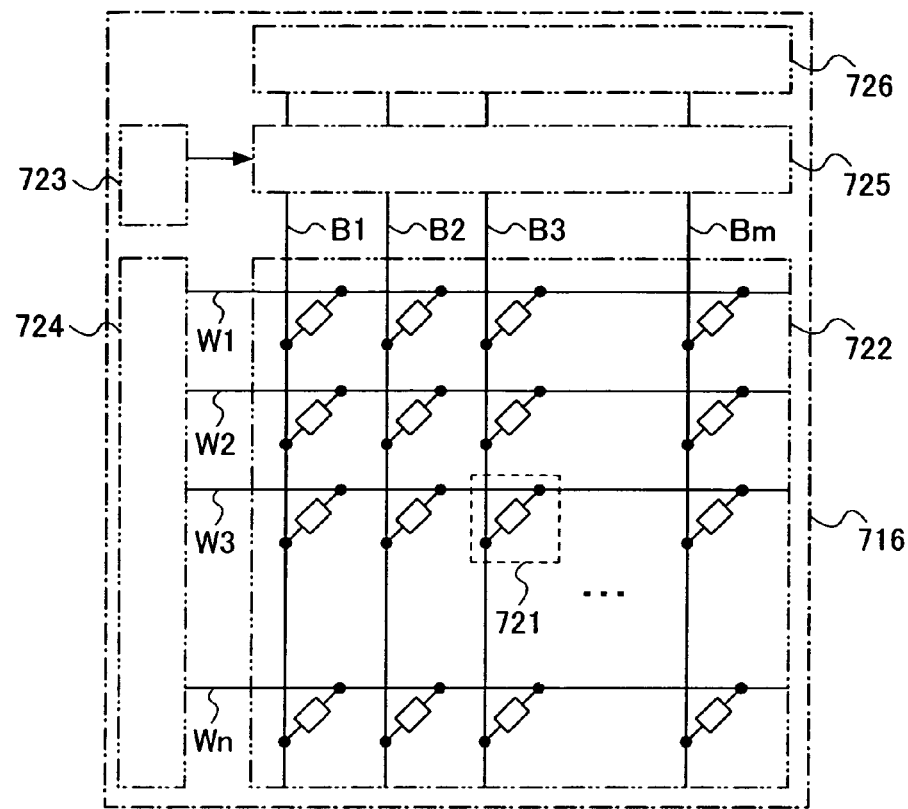
FIGS. 3A to 3C are views illustrating a semiconductor device of the present invention.
Figure 3B:
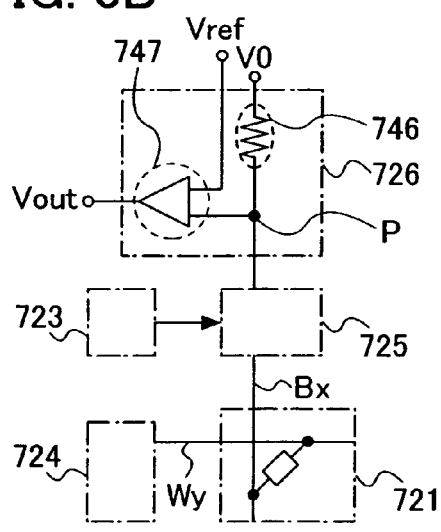
Figure 3C:
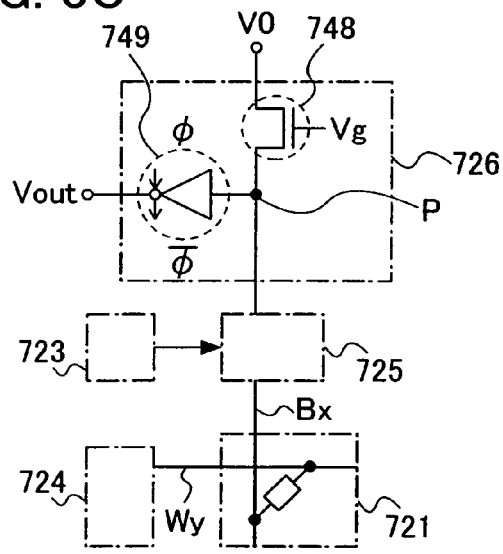

FIGS. 3A to 3C show one structural example of the semiconductor device of the present invention, which include a memory cell array 722 including memory cells 721 provided in matrix, a circuit 726 including a reading circuit and a writing circuit, a decoder 724, and a decoder 723. Note that the structure of a semiconductor device 716 shown here is only one example, the semiconductor device may include another circuit such as a sense amplifier, an output circuit, or a buffer, and the writing circuit may be provided in a bit-line driver circuit.

The memory cell array 722 includes a first conductive layer which is connected to a bit line Bx ($1 \leq x \leq m$), a second conductive layer which is connected to a word line Wy ($1 \leq y \leq n$), and an organic compound layer. The organic compound layer is provided between the first conductive layer and the second conductive layer, and is formed by a single layer or a plurality of stacked layers.

Figure 2A:
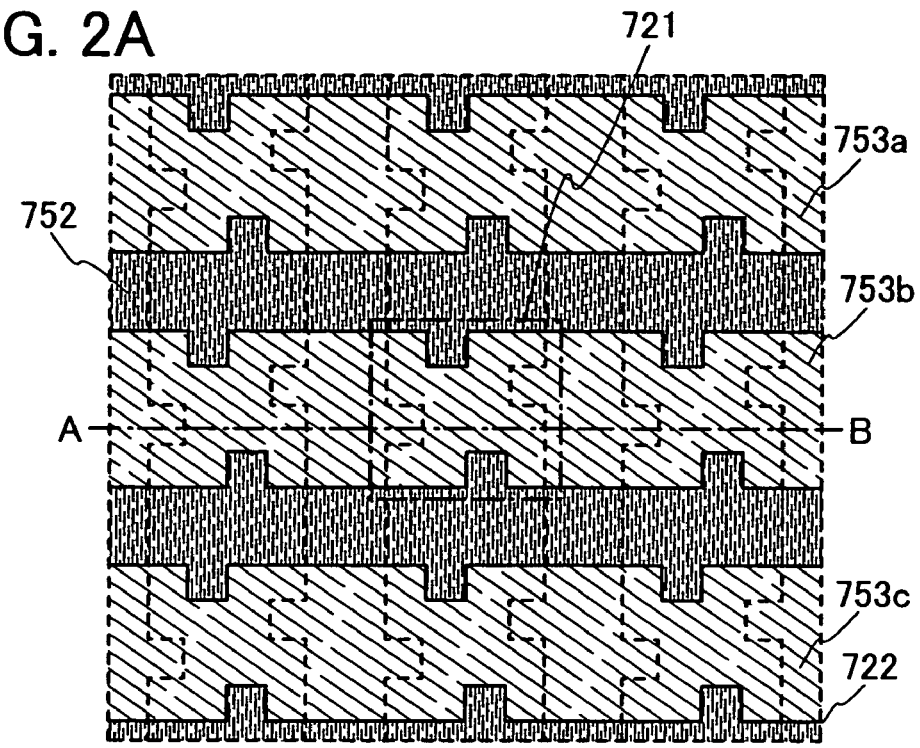
FIGS. 2A to 2C are views illustrating a semiconductor device of the present invention.
Figure 2B:
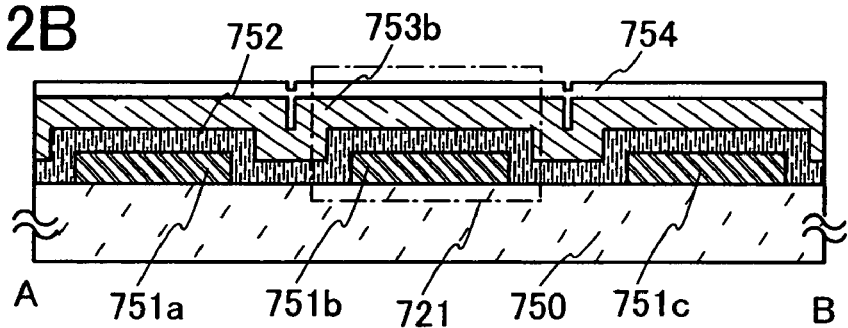
Figure 2C:
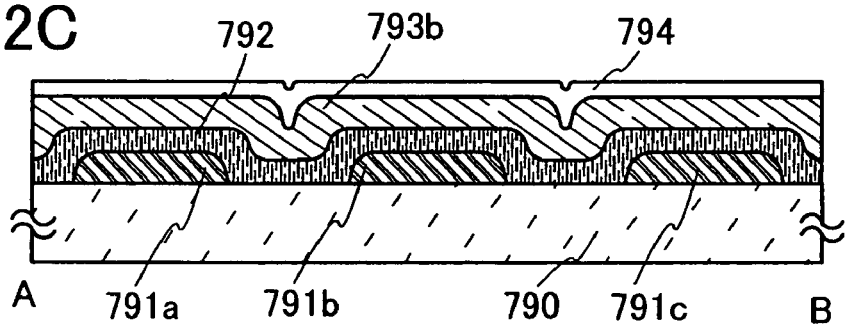

FIG. 2A is a top view of the memory cell array 722, and each of FIGS. 2B and 2C is a cross-sectional view taken along a line A-B in FIG. 2A. An insulating layer 754 is provided as shown in FIGS. 2B and 2C, though not shown in FIG. 2A.

The memory cell array 722 includes a first conductive layer 751a, a first conductive layer 751b, and a first conductive layer 751c, which are extended in a first direction; an organic compound layer 752 which is provided covering the first conductive layers 751a, 751b, and 751c; and a second conductive layer 753a, a second conductive layer 753b, and a second conductive layer 753c, which are extended in a second direction that is perpendicular to the first direction (FIG. 2A). The organic compound layer 752 is provided between the first conductive layers 751a, 751b, and 751c; and the second conductive layers 753a, 753b, and 753c. Further, the insulating layer 754 serving as a protection film is provided covering the second conductive layers 753a, 753b, and 753c (FIG. 2B). If there may be influence of an electric field in a lateral direction between adjacent memory cells, the organic compound layer 752 provided for each of the memory cells may also be separated.

FIG. 2C is a modification example of FIG. 2B, in which a first conductive layer 791a, a first conductive layer 791b, and a first conductive layer 791c, an organic compound layer 792, a second conductive layer 793b, and an insulating layer 794 which is a protection layer are formed over a substrate 790. Similarly to the first conductive layers 791a, 791b, and 791c in FIG. 2C, the first conductive layer may have a tapered shape and may have a shape in which its curvature radius changes continuously. A shape of the first conductive layers 791a, 791b, and 791c can be formed by using a droplet discharge method or the like. In the case where the first conductive layer has such a curved surface with curvature, coverage of an organic compound layer or a conductive layer to be stacked becomes good.

Further, a partition (an insulating layer) may be formed so as to cover an end of the first conductive layer. The partition (insulating layer) serves as a wall separating one memory element from another. Each of FIGS. 6A and 6B shows a structure in which an end of the first conductive layer is covered with the partition (insulating layer).

Figure 6A:
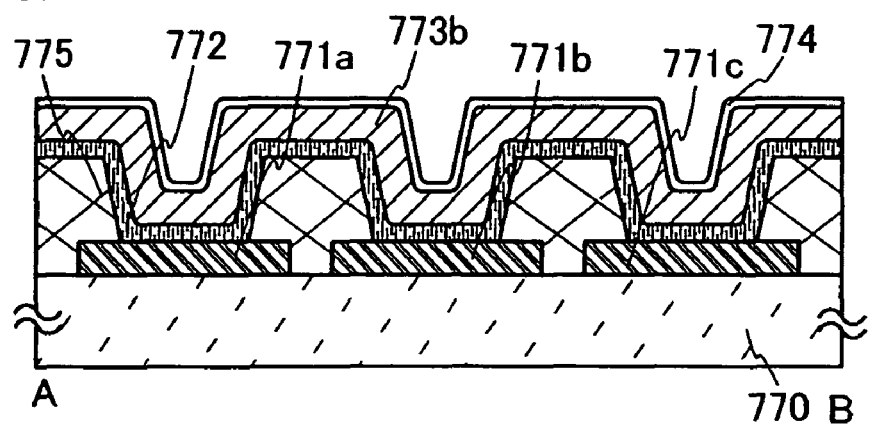
FIGS. 6A and 6B are views illustrating a semiconductor device of the present invention.

FIG. 6A shows an example where an organic compound layer 772 is formed over a first conductive layer 771a, a first conductive layer 771b, and a first conductive layer 771c; and a second conductive layer 773b is formed over the organic compound layer 772. In this embodiment mode, a partition (insulating layer) 775 serving as a partition is formed to cover ends of the first conductive layers 771a, 771b, and 771c and have a tapered shape. The first conductive layers 771a, 771b, and 771c are formed over a substrate 770, then the partition (insulating layer) 775 is formed thereover, and then, the organic compound layer 772, the second conductive layer 773b, and the insulating layer 774 are formed.

Figure 6B:
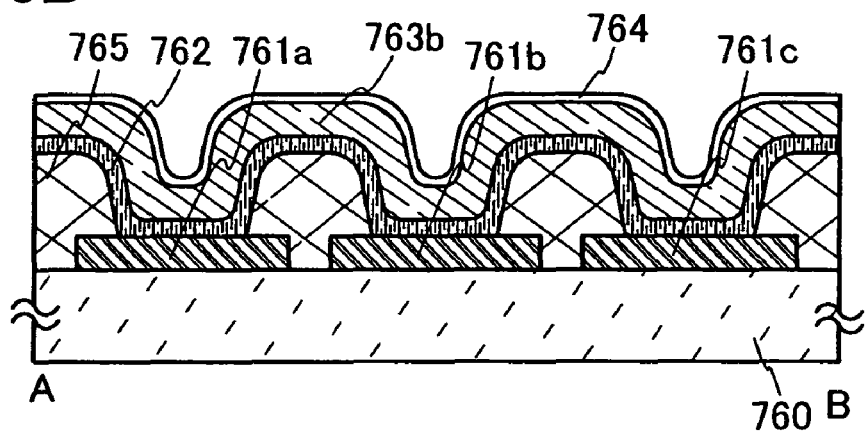

In a semiconductor device shown in FIG. 6B, a partition (an insulating layer) 765 has curvature and a shape in which its curvature radius changes continuously. FIG. 6B shows an example where an organic compound layer 762 is formed over a first conductive layer 761a, a first conductive layer 761b, and a first conductive layer 761c, and then a second conductive layer 763b is formed over the organic compound layer 762. An insulating layer 764 serving as a protection layer is formed over the second conductive layer 763b. The insulating layer 764 is not necessarily formed.

The first conductive layer, the organic compound layer, and the second conductive layer in FIGS. 2A to 2C, 6A and 6B may be manufactured using a similar material and a similar process to those in Embodiment Mode 1.

As each of the substrates 750, 760, 770, and 780 in structures of the foregoing memory cells, a quartz substrate, a silicon substrate, a metal substrate, a stainless steel substrate, or the like can be used as well as a glass substrate or a flexible substrate. A flexible substrate is a substrate that can be bent (flexible), such as a plastic substrate or the like formed of, for example, polycarbonate, polyarylate, or polyethersulfone. Alternatively, a film (formed of polypropylene, polyester, vinyl, polyvinyl fluoride, polyvinyl chloride, or the like), paper formed of a fibrous material, a base film (such as polyester, polyamide, an inorganic evaporation film, or paper), or the like can also be used. In addition, the memory cell array 722 can also be provided over a field-effect transistor (FET) that is formed over a semiconductor substrate of Si or the like, or the memory cell array 722 can be provided above a thin film transistor (TFT) that is formed over a substrate of glass or the like. The foregoing substrate may be polished or may be etched by solution after or during the formation of the memory element over the substrate so that the substrate is thinned.

In memory elements in FIGS. 2A to 2C, the first conductive layers 751a, 751b, and 751c and the second conductive layers 753a, 753b, and 753c have a projection and a depression on the periphery (on the edge) and angulated bends. Therefore, the memory cell 721 which is a memory element has a shape reflecting the shapes of the first conductive layer 751b and the second conductive layer 753b, and is not a rectangular (square) memory element, but is a memory element with a projection and a depression on the periphery.

A memory element having a shape such as shown in FIGS. 2A to 2C is manufactured to have a bend or a projection and a depression; therefore, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In the present invention, as a shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

As the partitions (insulating layers) 765 and 775, the following may be used: an inorganic insulating material such as silicon oxide, silicon nitride, silicon oxynitride, aluminum oxide, aluminum nitride, or aluminum oxynitride; acrylic acid, methacrylic acid, or a derivative thereof; a heat-resistant high molecule such as polyimide, aromatic polyamide, or polybenzimidazole; or a siloxane resin. Note that a siloxane resin is a resin having a Si—O—Si bond. The skeletal structure of siloxane is formed by a bond of silicon (Si) and oxygen (O). As a substituent, an organic group containing at least hydrogen (such as, an alkyl group or an aromatic hydrocarbon) is used. As the substituent, a fluoro group may also be used. Alternatively, an organic group containing at least hydrogen, and a fluoro group may be used as the substituent. The following resin material may also be used: a vinyl resin such as polyvinyl alcohol or polyvinyl butyral; or an epoxy resin, a phenol resin, a novolac resin, an acrylic resin, a melamine resin, or a urethane resin. Further, an organic material such as benzocyclobutene, parylene, or polyimide, or a composition material containing a water-soluble homopolymer and a water-soluble copolymer may also be used. As a manufacturing method of the partition (insulating layer), a vapor growth method such as a plasma CVD method or a thermal CVD method, or a sputtering method can be used. A droplet discharge method or a printing method (a method of forming a pattern, such as screen printing or offset printing) can also be used. Alternatively, a coating film or the like which is obtained by a coating method can also be used.

Further, after forming a conductive layer, an insulating layer, or the like by discharging a composition by a droplet discharge method, a surface thereof may be pressed with pressure to be planarized in order to increase planarity. As a method of pressing, unevenness may be reduced by moving using a roller-shaped object over the surface, or the surface may be pressed perpendicularly with a flat, plate-like object. At the time of pressing, a heating process may be performed. Alternatively, the surface may be softened or melted by flux or the like, and the uneven portion of the surface may be removed with an air knife. Further alternatively, the uneven portion of the surface may be polished using a CMP method. This step can be employed to planarize the surface when unevenness is generated by a droplet discharge method.

As shown in FIGS. 16A to 16C in Embodiment Mode 1, the insulating layer may be provided between the organic compound layer and the first conductive layer, between the organic compound layer and the second conductive layer, or may be provided both between first conductive layer and the organic compound layer, and between the second conductive layer and the organic compound layer. By providing the insulating layer, characteristics of the memory elements such as writing voltage are stabilized without variation; therefore, normal writing to each element can be carried out. Further, since a carrier injecting property is improved by providing the insulating layer, the thickness of the organic compound layer can be increased. Accordingly, a defect that the memory element is short-circuited in an initial state before electrical conduction can be prevented.

In the foregoing structures of this embodiment mode, an element having a rectifying property may be provided between the first conductive layers 751a to 751c and the organic compound layer 752, between the first conductive layers 761a to 761c and the organic compound layer 762, between the first conductive layers 771a to 771c and the organic compound layer 772, and between the first conductive layers 791a to 791c and the organic compound layer 792. The element having a rectifying property is a transistor in which a gate electrode and a drain electrode are connected, or a diode. The provision of the diode having a rectifying property reduces an error and improves reliability of reading since current flows only in one direction. Note that the element having a rectifying property may also be provided between the organic compound layer 752 and the second conductive layers 753a to 753c, between the organic compound layer 762 and the second conductive layer 763b, between the organic compound layer 772 and the second conductive layer 773b, and between the organic compound layer 792 and the second conductive layer 793b.

According to the present invention, characteristics of memory elements are stabilized without variation, so that normal writing can be carried out. Therefore, a semiconductor device with improved reliability can be manufactured with a high yield without complicating an apparatus or a process.

Embodiment Mode 3

In this embodiment mode, a semiconductor device having a structure different from that of Embodiment Mode 2 is described. In particular, the case where the semiconductor device is an active matrix type is described. A memory element in this embodiment mode can be manufactured of the same material and to have the same structure as that in Embodiment Mode 1, and therefore, detailed description of the material or the like is omitted here.

Figure 5A:
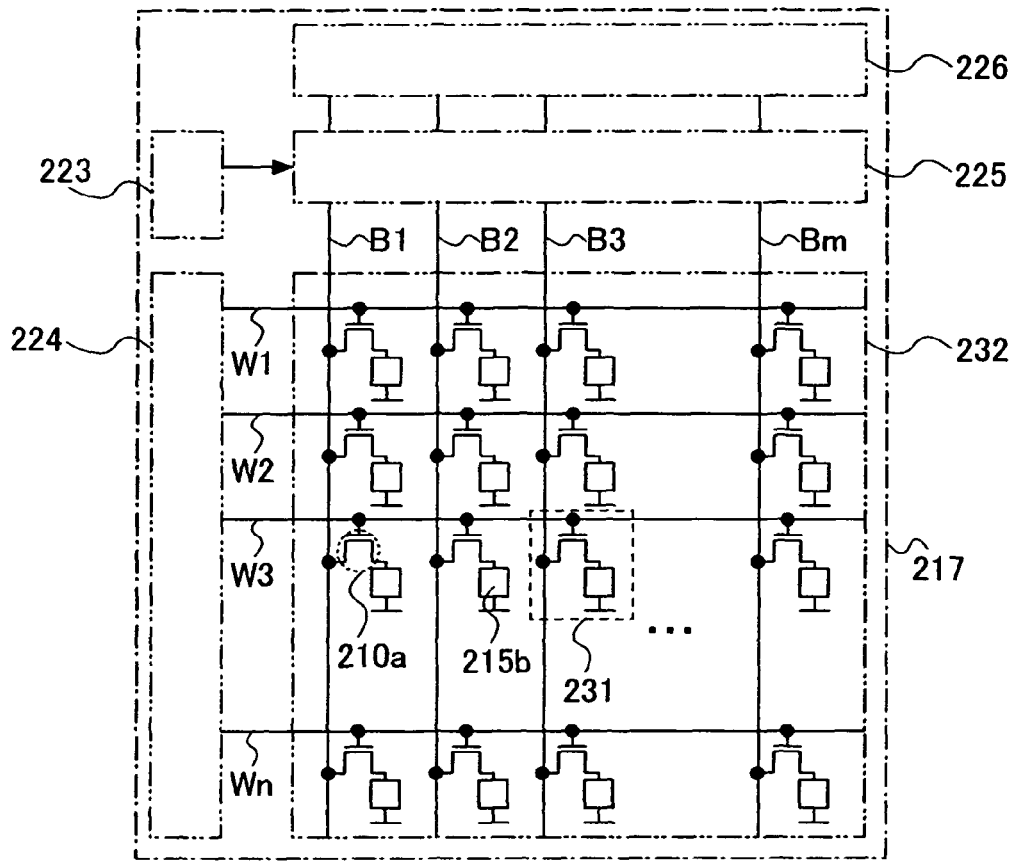
FIGS. 5A to 5C are views illustrating a semiconductor device of the present invention.
Figure 5B:
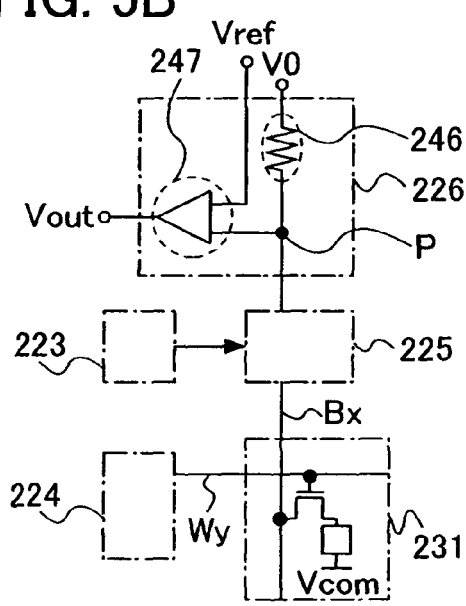
Figure 5C:
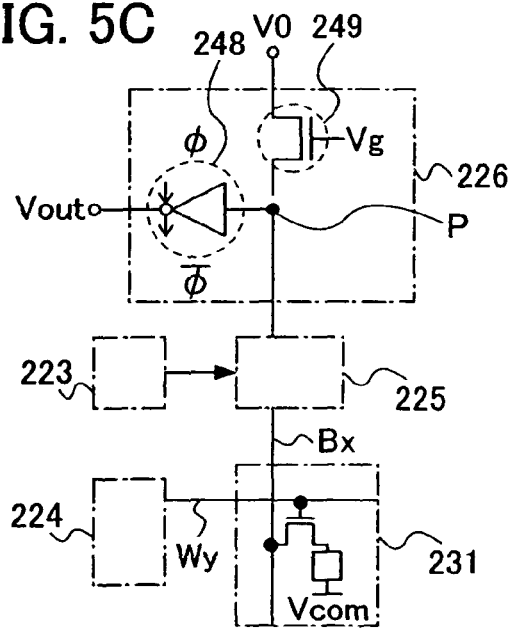

FIGS. 5A to 5C show one structural example of the semiconductor device of this embodiment mode, which includes a memory cell array 232 including memory cells 231 arranged in matrix, a circuit 226, a decoder 224, and a decoder 223. The circuit 226 includes a reading circuit and a writing circuit. Note that the structure of a semiconductor device 217 shown here is only one example; the semiconductor device may include another circuit such as a sense amplifier, an output circuit, or a buffer, and the writing circuit may be provided in a bit-line driver circuit.

The memory cell array 232 includes a first conductive layer connected to a bit line Bx ($1 \leq x \leq m$), a second conductive layer connected to a word line Wy ($1 \leq y \leq n$), transistors 210a, memory elements 215b, and the memory cells 231. The memory element 215b has a structure in which an organic compound layer is interposed between a pair of conductive layers. The transistor has a gate electrode connected to the word line, a source electrode and a drain electrode either of which is connected to the bit line, and the other of which is connected to one of two terminals of the memory element. The other terminal of the memory element is connected to a common electrode (a potential of Vcom).

Figure 4A:
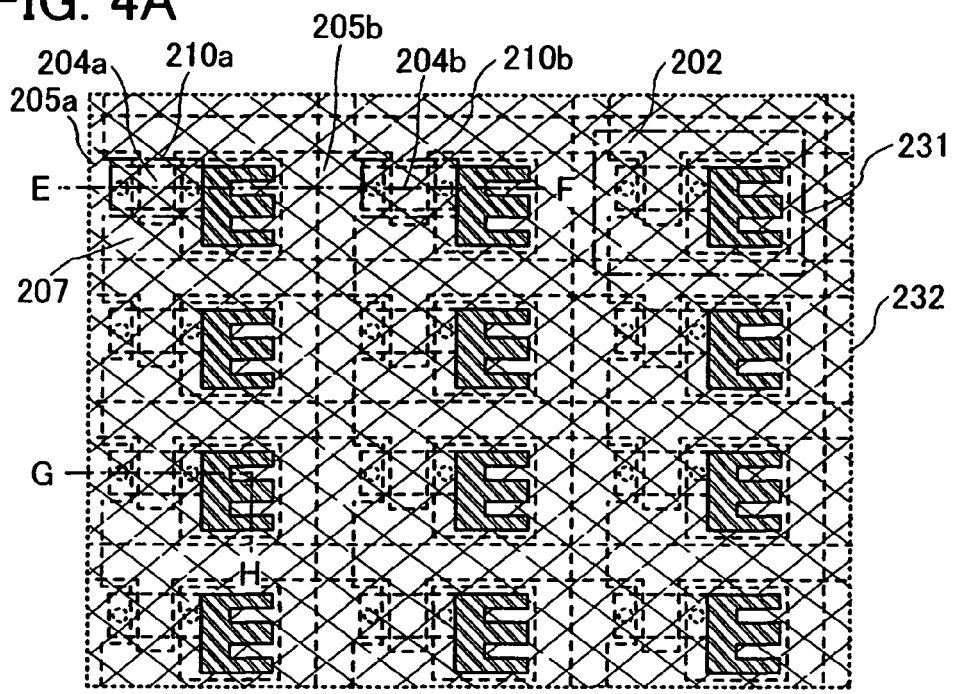
FIGS. 4A and 4B are views illustrating a semiconductor device of the present invention.
Figure 4B:
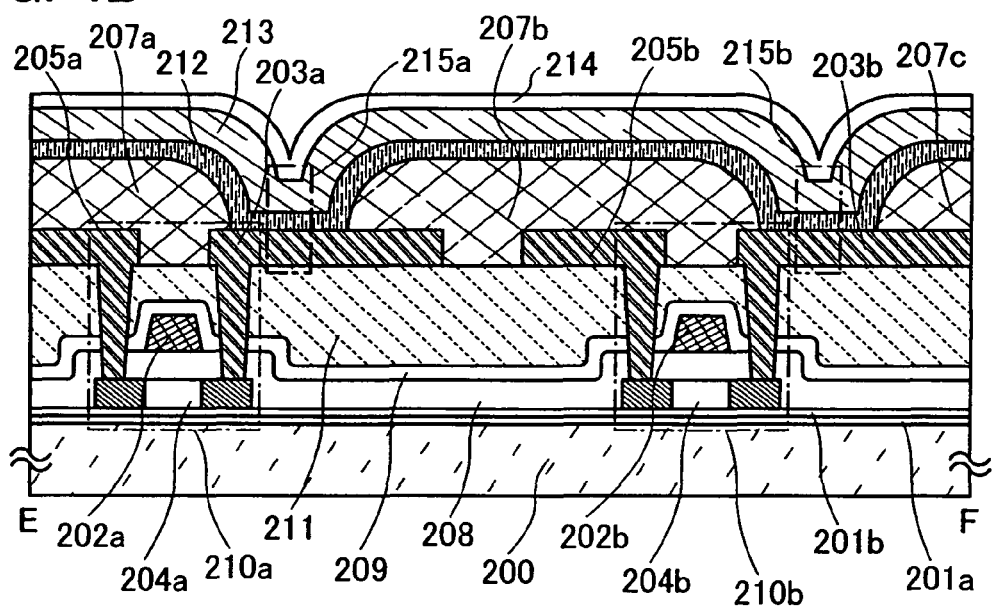

FIG. 4A is a top view of the memory cell array 232, and FIG. 4B is a cross-sectional view along a line E-F in FIG. 4A. An organic compound layer 212, a second conductive layer 213, and an insulating layer 214 are provided as shown in FIG. 4B, though not shown in FIG. 4A.

In the memory cell array 232, a first wiring 205a and a first wiring 205b which are extended in a first direction, and a second wiring 202 which is extended in a second direction that is perpendicular to the first direction are provided in matrix. The first wirings 205a and 205b are connected to either source electrodes or drain electrodes of the transistor 210a and a transistor 210b, whereas the second wiring 202 is connected to gate electrodes of the transistors 210a and 210b. The others of the source electrodes and the drain electrodes of the transistor 210a and the transistor 210b, which are not connected to the first wirings 205a and 205b, are connected to a first conductive layer 203a and a first conductive layer 203b, respectively. A memory element 215a and the memory element 215b are provided by stacking the first conductive layer 203a and the first conductive layer 203b, the organic compound layer 212, and the second conductive layer 213. A partition (an insulating layer) 207 is provided between each of the neighboring memory cells 231, and the organic compound layer 212 and the second conductive layer 213 are stacked over the first conductive layer and the partition (insulating layer) 207 (207a, 207b and 207c). The insulating layer 214 which is a protection layer is provided over the second conductive layer 213. In addition, a thin film transistor is used as each of the transistors 210a and 210b (FIG. 4B).

The first conductive layer, the organic compound layer, and the second conductive layer in FIGS. 2A to 2C, 6A and 6B may be manufactured using a similar material and a similar process to those in Embodiment Mode 1.

As each of substrates 200 and 280 in structures of the foregoing memory cells, a quartz substrate, a silicon substrate, a metal substrate, a stainless-steel substrate, or the like can be used as well as a glass substrate or a flexible substrate. A flexible substrate is a substrate that can be bent (flexible), such as a plastic substrate or the like formed of, for example, polycarbonate, polyarylate, or polyethersulfone. Alternatively, a film (formed of polypropylene, polyester, vinyl, polyvinyl fluoride, polyvinyl chloride, or the like), paper formed of a fibrous material, a base film (such as polyester, polyamide, an inorganic evaporation film, or paper), or the like can also be used. In addition, the memory cell array can also be provided over a field-effect transistor (FET) that is formed over a semiconductor substrate of Si or the like, or the memory cell array 722 can be provided above a thin film transistor (TFT) that is formed over a substrate of glass or the like.

In memory elements in FIGS. 4A and 4B, the first conductive layers 203a and 203b have a projection and a depression on the peripheries, and are comb-shaped. The memory elements 215a and 215b have shapes reflecting the shapes of the first conductive layers 203a and 203b; therefore, comb-shaped memory elements with a projection and a depression on the peripheries are formed in stead of rectangular (square) memory elements.

A memory element having a shape such as shown in FIGS. 4A and 4B is manufactured to have a bend or a projection and a depression, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In the present invention, as a shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

The semiconductor device of FIG. 4B is formed over the substrate 200, and includes an insulating layer 201a, an insulating layer 201b, an insulating layer 208, an insulating layer 209, an insulating layer 211, a semiconductor layer 204a included in the transistor 210a, a gate electrode layer 202a, a wiring 205a also serving as a source electrode layer or a drain electrode layer, a semiconductor layer 204b included in the transistor 210b, and a gate electrode layer 202b.

As shown in FIGS. 16A to 16C in Embodiment Mode 1, the insulating layer may be provided between the organic compound layer and the first conductive layer, between the organic compound layer and the second conductive layer, or may be provided both between first conductive layer and the organic compound layer, and between the second conductive layer and the organic compound layer. By providing the insulating layer, characteristics of the memory elements such as writing voltage are stabilized without variation; therefore, normal writing to each element can be carried out. Further, since a carrier injecting property is improved by providing the insulating layer, the thickness of the organic compound layer can be increased. Accordingly, a defect that the memory element is short-circuited in an initial state before electrical conduction can be prevented.

An interlayer insulating layer may be provided over the transistors 210a and 210b. In the structure shown in FIG. 4B, the memory elements 215a and 215b need to be formed in a region other than the source electrode layer and the drain electrode layer of the transistors 210a and 210b. However, the provision of the insulating layer makes it possible to form the memory elements 215a and 215b over the transistors 210a and 210b. As a result, higher-integration of the semiconductor device 217 can be realized.

The transistors 210a and 210b can have any structure as long as they can function as switching elements. Various semiconductors such as an amorphous semiconductor, a crystalline semiconductor, a polycrystalline semiconductor, and a microcrystalline semiconductor can be used for the semiconductor layer, and an organic transistor may be formed using an organic compound. Although FIG. 4B shows the case where a planar thin film transistor is provided over a substrate having an insulating property, a staggered or inversely-staggered transistor can be formed.

As a material for forming the semiconductor layer of the transistors 210a and 210b, an amorphous semiconductor (hereinafter also referred to as AS) manufactured using a semiconductor material gas typified by silane or germane by a vapor phase growth method or a sputtering method, a polycrystalline semiconductor formed by crystallizing the amorphous semiconductor by utilizing light energy or thermal energy, a semiamorphous (also referred to as microcrystalline or microcrystal) semiconductor (hereinafter also referred to as SAS), or the like can be used. The semiconductor layer can be formed by a known method (such as a sputtering method, an LPCVD method, or a plasma CVD method).

SAS is a semiconductor having an intermediate structure between an amorphous structure and a crystalline (including single crystalline and polycrystalline) structure and having a third state which is stable in free energy, and has a crystalline region with short-range order and lattice distortion. SAS is formed by glow discharge decomposition (plasma CVD) of a gas containing silicon. As the gas containing silicon, $Si_2H_6$, $SiH_2Cl_2$, $SiHCl_3$, $SiCl_4$, $SiF_4$, or the like, as well as $SiH_4$, can be used. Further, $F_2$ or $GeF_4$ may be mixed into the foregoing gas. This gas containing silicon may be diluted with $H_2$, or $H_2$ and one or more rare gas elements of He, Ar, Kr, or Ne. Alternatively, a stacked-layer including an SAS layer formed using a hydrogen-based gas and an SAS layer formed using a fluorine-based gas may be used as the semiconductor layer.

As an example of a typical amorphous semiconductor, hydrogenated amorphous silicon can be given while polysilicon or the like can be given as an example of a crystalline semiconductor. Polysilicon (polycrystalline silicon) includes a so-called high-temperature polysilicon formed using polysilicon which is formed at a processing temperature of 800° C. or higher as a main material, a so-called low-temperature polysilicon formed using polysilicon which is formed at a processing temperature of 600° C. or lower as a main material, polysilicon crystallized by adding an element which promotes crystallization, and the like. As described above, it is needless to say that a semiamorphous semiconductor or a semiconductor which includes a crystalline phase in a portion thereof can be used Further, as a material of the semiconductor, a compound semiconductor such as GaAs, InP, SiC, ZnSe, GaN, or SiGe can be used as well as an elementary substance such as silicon (Si) or germanium (Ge). Alternatively, an oxide semiconductor such as zinc oxide (ZnO) or tin oxide ($SnO_2$) can also be used. In the case of using ZnO for the semiconductor layer, the gate insulating layer may be preferably formed of $Y_2O_3$, $Al_2O_3$, $TiO_2$, a stacked-layer thereof, or the like; and the gate electrode layer, the source electrode layer, and the drain electrode layer may be preferably formed of ITO, Au, Ti, or the like. In addition, In, Ga, or the like can be added to ZnO.

In the case where a crystalline semiconductor layer is used as the semiconductor layer, a known method (such as laser crystallization, thermal crystallization, or thermal crystallization which uses an element for promoting crystallization such as nickel) may be employed as its manufacturing method. Alternatively, a microcrystalline semiconductor which is SAS can be crystallized by laser light irradiation to improve its crystallinity. In the case where the element for promoting crystallization is not injected, hydrogen is released until the concentration thereof contained in an amorphous silicon film is reduced to be $1\times10^{20}$ atoms/cm$^3$ or less by heating the amorphous silicon film at a temperature of 500° C. for one hour in a nitrogen atmosphere before irradiating the amorphous silicon film with laser light. This is because the amorphous silicon film containing much hydrogen is damaged when the film is irradiated with laser light.

Any method can be used for injecting a metal element into the amorphous semiconductor layer as long as it can make the metal element exist on a surface of or inside the amorphous semiconductor layer. For example, sputtering, CVD, plasma treatment (including plasma CVD), an adsorption method, or a method applying a metal salt solution can be employed. Among them, the method using a solution is simple and advantageous in easy control of the concentration of the metal element. In addition, at this time, it is desirable to form an oxide film by UV light irradiation in an oxygen atmosphere, a thermal oxidation method, treatment with ozone water containing a hydroxyl radical or hydrogen peroxide, or the like in order to improve wettability of a surface of the amorphous semiconductor layer and to spread the aqueous solution across the entire surface of the amorphous semiconductor layer.

At the crystallization step for forming a crystalline semiconductor layer by crystallizing the amorphous semiconductor layer, an element (also referred to as a catalytic element or a metal element) which promotes crystallization may be added to the amorphous semiconductor layer and heat treatment (at 550° C. to 750° C. for 3 minutes to 24 hours) may be performed for crystallization. As the element which promotes crystallization, one or plural kinds of metal elements of iron (Fe), nickel (Ni), cobalt (Co), ruthenium (Ru), rhodium (Rh), palladium (Pd), osmium (Os), iridium (Ir), platinum (Pt), copper (Cu), or gold (Au) can be used.

In order to remove or reduce the element which promotes crystallization in the crystalline semiconductor layer, a semiconductor layer containing an impurity element is formed in contact with the crystalline semiconductor layer so as to serve as a gettering sink. As the impurity element, an impurity element imparting n-type conductivity, an impurity element imparting p-type conductivity, a rare gas element, or the like can be used; for example, one or plural kinds of elements of phosphorus (P), nitrogen (N), arsenic (As), antimony (Sb), bismuth (Bi), boron (B), helium (He), neon (Ne), argon (Ar), krypton (Kr), and xenon (Xe) can be used. The semiconductor layer containing a rare gas element is formed over the crystalline semiconductor layer containing the element which promotes crystallization, and heat treatment is performed (at 550° C. to 750° C. for 3 minutes to 24 hours). The element which promotes crystallization in the crystalline semiconductor layer moves into the semiconductor layer containing the rare gas element, so that the element which promotes crystallization in the crystalline semiconductor layer is removed or reduced. After that, the semiconductor layer containing the rare gas element, which serves as the gettering sink, is removed.

Crystallization by heat treatment and laser light irradiation may be combined to crystallize the amorphous semiconductor layer. Alternatively, either heat treatment or laser light irradiation may be performed plural times.

The crystalline semiconductor layer may be directly formed over the substrate by a plasma method. Alternatively, the crystalline semiconductor layer may be selectively formed over the substrate by a plasma method.

The semiconductor layer can be formed using an organic semiconductor material by a printing method, a spray method, a spin-coating method, a droplet discharge method, or the like. In this case, since the above etching step is not required, the number of steps can be reduced. A low-molecular material, a high-molecular material, or the like is used as the organic semiconductor material, and a material such as an organic pigment or a conductive high-molecular material can be used as well. A high-molecular material with π-electron conjugated system having a skeleton including conjugated double bonds is preferably used as the organic semiconductor material. Typically, a soluble high-molecular material such as polythiophene, polyfluorene, poly(3-alkylthiophene), a polythiophene derivative, pentacene, or the like can be used.

In addition to the foregoing materials, a material which can form the semiconductor layer by processing a soluble precursor after the deposition can be given as the organic semiconductor material applicable to the present invention. As such an organic semiconductor material, there is polythienylenevinylene, poly(2,5-thienylenevinylene), polyacetylene, a polyacetylene derivative, polyarylenevinylene, or the like.

When converting the precursor into an organic semiconductor, a reaction catalyst such as a hydrogen chloride gas is added as well as performing heat treatment. The following can be employed as a typical solvent which dissolves the soluble organic semiconductor material: toluene, xylene, chlorobenzene, dichlorobenzene, anisole, chloroform, dichloromethane, γ butyl lactone, butyl cellosolve, cyclohexane, NMP (N-methyl-2-pyrrolidone), cyclohexanone, 2-butanone, dioxane, dimethylformamide (DMF), THF (tetrahydrofuran), or the like.

The gate electrode layer can be formed by CVD, sputtering, a droplet discharge method, or the like. The gate electrode layer may be formed of an element selected from Ag, Au, Cu, Ni, Pt, Pd, Ir, Rh, W, Al, Ta, Mo, Cd, Zn, Fe, Ti, Si, Ge, Zr, or Ba; or an alloy material or a compound material containing any of the elements as its main component. Alternatively, a semiconductor film which is typified by a polycrystalline silicon film doped with an impurity element such as phosphorus, or an AgPdCu alloy may be used as well. Either a single-layer structure or a stacked-layer structure may be employed; for example, a two-layer structure including a tungsten nitride film and a molybdenum film may be employed or a three-layer structure including a tungsten film with a thickness of 50 nm, an aluminum-silicon alloy (Al—Si) film with a thickness of 500 nm, and a titanium nitride film with a thickness of 30 nm are stacked sequentially may be employed. In the case of employing the three-layer structure, tungsten nitride may be used instead of tungsten for the first conductive film, an aluminum-titanium alloy (Al—Ti) film may be used instead of the aluminum-silicon alloy (Al—Si) film of the second conductive film, and a titanium film may be used instead of the titanium nitride film of the third conductive film.

A light-transmitting material having light-transmitting property to visible light can also be used for the gate electrode. As a light-transmitting conductive material, indium tin oxide (ITO), indium tin oxide containing silicon oxide (ITSO), organic indium, organic tin, zinc oxide, or the like can be used. Alternatively, indium zinc oxide (IZO) containing zinc oxide (ZnO), gallium (Ga) doped ZnO, tin oxide ($SnO_2$), indium oxide containing tungsten oxide, indium zinc oxide containing tungsten oxide, indium oxide containing titanic oxide, indium tin oxide containing titanic oxide, or the like may be used as well.

If etching process is required to form the gate electrode layer, a mask may be formed and dry etching or wet etching may be performed. The electrode layer can be etched into a tapered shape by using an ICP (Inductively Coupled Plasma) etching method and appropriately adjusting the etching condition (such as the amount of electric power applied to a coiled electrode, the amount of electric power applied to an electrode on a substrate side, or a temperature of the electrode on the substrate side). As an etching gas, a chlorine-based gas typified by $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

Although description is made of a single gate structure in this embodiment mode, a multi-gate structure such as a double-gate structure may also be employed. In this case, gate electrode layers may be provided above and below the semiconductor layer or a plurality of gate electrode layers may be provided on only one side (that is, above or below) of the semiconductor layer. The semiconductor layer may include impurity regions having different concentrations. For example, a region where the gate electrode layer is stacked and the vicinity of a channel region of the semiconductor layer may be formed to be a low-concentration impurity region, while a region outside the low-concentration impurity region may be formed to be a high-concentration impurity region.

Figure 7A:
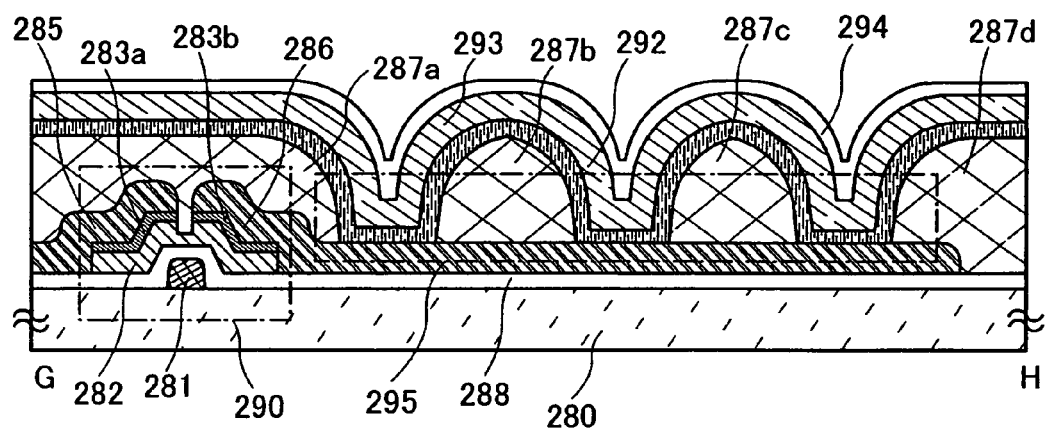
FIGS. 7A and 7B are views illustrating a semiconductor device of the present invention.
Figure 7B:
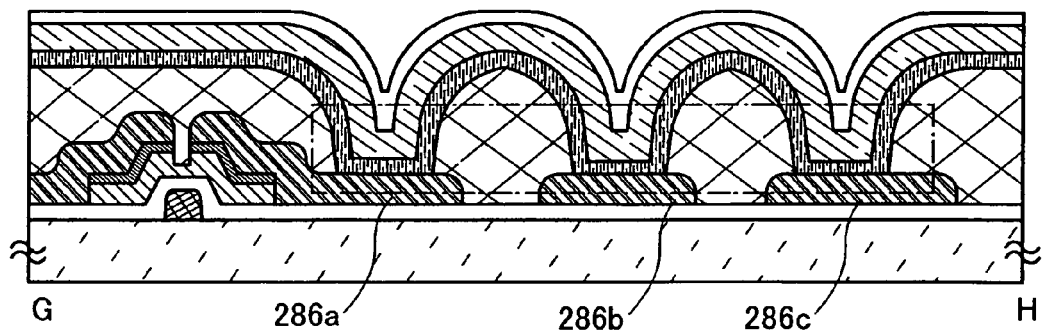

FIGS. 7A and 7B show an example in which an inversely-staggered thin film transistor is used. FIGS. 7A and 7B are cross-sectional views corresponding to a cross section along a line G-H in the semiconductor device of FIG. 4A. A transistor 290, which is an inversely-staggered thin film transistor, is provided over the substrate 280. The transistor 290 includes an insulating layer 288, a gate electrode layer 281, an amorphous semiconductor layer 282, a semiconductor layer 283a having one conductivity, a semiconductor layer 283b having one conductivity, and a source electrode layer or a drain electrode layer 285. The other of the source electrode layer or the drain electrode layer is a first conductive layer 286 forming a memory element. The first conductive layer 286 is selectively covered with a partition (insulating layer) 287a, a partition (insulating layer) 287b, a partition (insulating layer) 287c, and a partition (insulating layer) 287d. In a region where the partitions (insulating layers) are not formed over the first conductive layer 286, an organic compound layer 292 is formed to be in contact with the first conductive layer 286. A second conductive layer 293 and an insulating layer 294 which is a protection layer are formed over the organic compound layer 292, thereby forming a memory element 295.

FIG. 7A shows an example of the memory element 295, where the partition formed over the first conductive layer 286 is selectively provided so that the organic compound layer formed over the first conductive layer 286 to be in contact with each other is selectively formed in a desired region selectively. In this case, the organic compound layer is not formed to be in contact with the first conductive layer in a region where the partition is formed. FIG. 7B shows an example where the first conductive layer 286 is also processed into a shape corresponding to that of the memory element 295. In FIG. 7A the first conductive layer 286 below the partition is continuously formed. On the other hand, in FIG. 7B, the first conductive layer may be processed so as to have a shape corresponding to the shape of the memory element and to be a first conductive layer 286a, a first conductive layer 286b, and a first conductive layer 286c. FIG. 7B is a cross-sectional view along the line G-H, therefore, although the first conductive layers 286a to 286c seem to be discontinuous, they are continuous as shown in FIG. 4A.

In the present invention, a memory element which includes conductive layers (a first conductive layer and a second conductive layer) serving as a pair of electrodes and an organic compound layer interposed therebetween is used as a memory element. Thus, the memory element is a stacked-layer region which includes at least the first conductive layer, the organic compound layer, and the second conductive layer. A shape of the memory element refers to a shape of the stacked-layer body. Therefore, the shape of the memory element can be controlled by each shape of the first conductive layer, the organic compound layer, and the second conductive layer. For example, in order to form the memory element having a shape such as described above, the first conductive layer is formed into a desired shape. Then, the organic compound layer and the second conductive layer are stacked over the first conductive layer formed into the desired shape, whereby the memory element reflecting the shape of the first conductive layer is formed. In addition, an insulating layer serving as a partition may be formed selectively over the first conductive layer, whereby a region where the organic compound layer is in contact with the first conductive layer can be selectively controlled.

In the semiconductor device shown in FIGS. 7A and 7B, the gate electrode layer 281, the source electrode layer or drain electrode layer 285, the first conductive layer 286, the partition (insulating layer) 287 may be formed using a droplet discharge method. A droplet discharge method is a method in which a fluid composition containing a component-forming material is discharged (ejected) as a droplet to be formed into a desired pattern. A droplet containing a component-forming material is discharged into the region in which the component is formed and is solidified by baking, drying, and the like to form the component into the desired pattern.

In the case of forming a conductive layer by a droplet discharge method, the conductive layer is formed as follows: a composition containing a particle-shaped conductive material is discharged, and fused or welded by baking to be solidified. A conductive layer (or an insulating layer) formed by thus discharging and baking the composition containing the conductive material tends to have a polycrystalline state having many grain boundaries whereas a conductive layer (or an insulating layer) formed by a sputtering method tends to have a columnar structure.

Figure 8A:
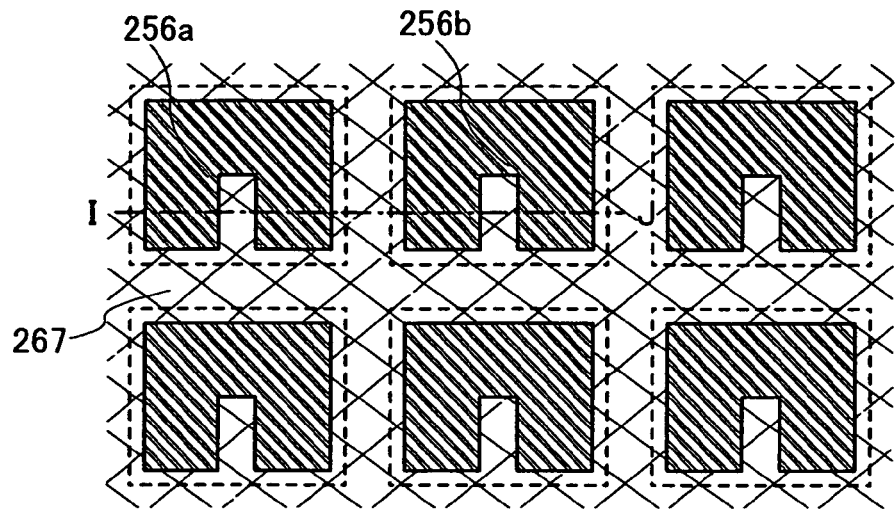
FIGS. 8A and 8B are views illustrating a semiconductor device of the present invention.
Figure 8B:
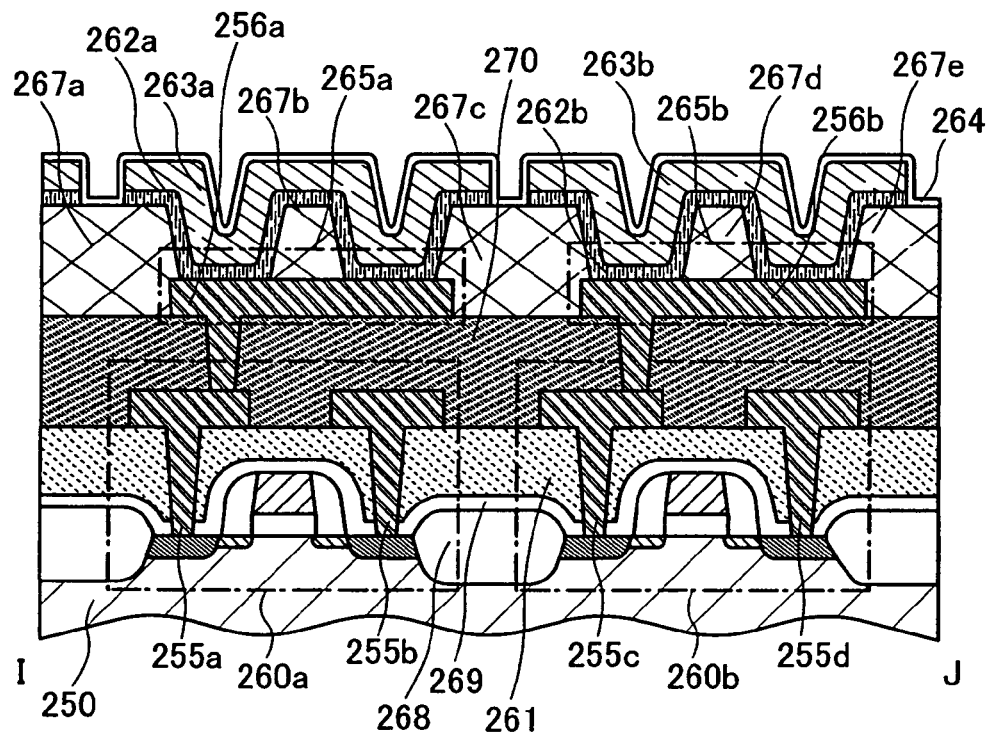

As shown in FIGS. 8A and 8B, a semiconductor device of the present invention can be manufactured by using a single crystalline semiconductor substrate. FIG. 8A is a top view of the semiconductor device and FIG. 8B is a cross-sectional view along a line I-J in FIG. 8A. As shown in FIGS. 8A and 8B, a memory element 265a and a memory element 265b are connected to a filed-effect transistor 260a and a filed-effect transistor 260b formed over a single crystalline semiconductor substrate 250. Here, an insulating layer 270 is provided so as to cover source electrode layers or drain electrode layers 255a to 225d of the filed-effect transistors 260a and 260b. A first conductive layer 256a, a first conductive layer 256b, partitions (insulating layers) 267(267a to 267e), an organic compound layer 262a, an organic compound layer 262b, a second conductive layer 263a, and a second conductive layer 263b are stacked over the insulating layer 270, thereby forming the memory element 265a and the memory element 265b. The organic compound layer may be selectively provided only for the each memory cell using a mask or the like, as in the case of the organic compound layer 262a and the organic compound layer 262b. The semiconductor device shown in FIGS. 8A and 8B also include an element isolation region 268, an insulating layer 269, an insulating layer 261, and an insulating layer 264.

In FIGS. 8A and 8B, the memory elements 265a and 265b have squared U-shapes with a projection and a depression on the periphery, reflecting a shape of an opening hole in the partition formed over the first conductive layer. Therefore, in FIG. 8B, which is the cross-sectional view along the line I-J of FIG. 8A, the partitions (insulating layers) 267a to 267c are formed selectively over the first conductive layer 256a, and the partitions (insulating layers) 267c to 267e are formed selectively over the first conductive layer 256b. The organic compound layer 262a, the organic compound layer 262b the second conductive layer 263a, and the second conductive layer 263b are stacked in a region over the first conductive layer 256a and the first conductive layer 256b, except for the region where the partitions (insulating layers) 267a to 267e are formed. Thus, the memory element 265a and the memory element 265b having angulated bends are formed.

By forming the memory elements with the insulating layer 270 provided, the first conductive layer can be freely placed. In other words, in the structure of FIG. 4B, it is necessary to prevent the memory elements 215a and 215b from being provided in regions where the source electrode layers or the drain electrode layers of the transistors 210a and 210b are formed; however, according to the foregoing structure, the memory elements 215a and 215b can be formed, for example, above the transistors 210a and 210b. As a result, higher-integration of the semiconductor device 217 becomes possible.

A memory element having a shape such as shown in FIGS. 8A and 8B is manufactured to have a bend or a projection and a depression; therefore, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

Further, the semiconductor layer in each transistor may have any structure. For example, an impurity region (including a source region, a drain region, and an LDD region) may be formed, or either a p-channel type or an n-channel type may be formed. In addition, an insulating layer (a sidewall) may be formed in contact with a side surface of the gate electrode, or and a silicide layer may be formed in one or both of a source/drain region and the gate electrode. As a material of the silicide layer, nickel, tungsten, molybdenum, cobalt, platinum, or the like can be used.

The first conductive layers 203a, 203b, 256a, 256b, and 286 and the second conductive layers 213, 263a, 263b, and 293 shown in this embodiment mode can be manufactured using a similar material and a similar forming method to any of those shown in Embodiment Mode 1.

The organic compound layers 212, 262a, 262b, and 292 can be provided using a similar material and a similar forming method to those shown in Embodiment Mode 1.

Note that an element having a rectifying property may be provided between the first conductive layers 203a, 203b, 256a, 256b, and 286 and the organic compound layer 212, 262a, 262b, and 292. The element having a rectifying property refers to a transistor in which a gate electrode and a drain electrode are connected, or a diode. For example, a pn junction diode which is provided by stacking an n-type semiconductor layer and a p-type semiconductor layer can be used. The provision of the diode having a rectifying property reduces an error and improves reliability of reading since current flows only in one direction. In the case of providing a diode, a diode other than the pn junction diode, such as a pin junction diode or an avalanche diode may also be used. Note that the element having a rectifying property may be provided between the organic compound layers 212, 262a, 262b, and 292, and the second conductive layer 213, 263a, 263b, and 293.

According to the present invention, characteristics of memory elements are stabilized without variation, so that normal writing can be carried out. Therefore, a semiconductor device with improved reliability can be manufactured with a high yield without complicating an apparatus or a process.

Embodiment Mode 4

In this embodiment mode, an example of the semiconductor devices described in the foregoing embodiment modes is described with reference to drawings.

A semiconductor device described in this embodiment mode is capable of contactless reading and writing of data. Data transmission method is broadly classified into three methods of an electromagnetic coupling method in which communication is performed by mutual induction with a pair of coils disposed opposite to each other, an electromagnetic induction method in which communication is performed by an inductive electromagnetic field, and an electric wave method in which communication is performed by using electric waves; and any of these methods may be employed. An antenna that is used for transmitting data can be provided in two ways. One way is to provide an antenna over a substrate provided with a plurality of elements and memory elements, and the other way is to provide a terminal portion for a substrate provided with a plurality of elements and memory elements and connect an antenna provided over another substrate to the terminal portion.

First, an example of a structure of the semiconductor device in the case where an antenna is provided over a substrate provided with a plurality of elements and memory elements is described with reference to FIG. 10.

Figure 10:
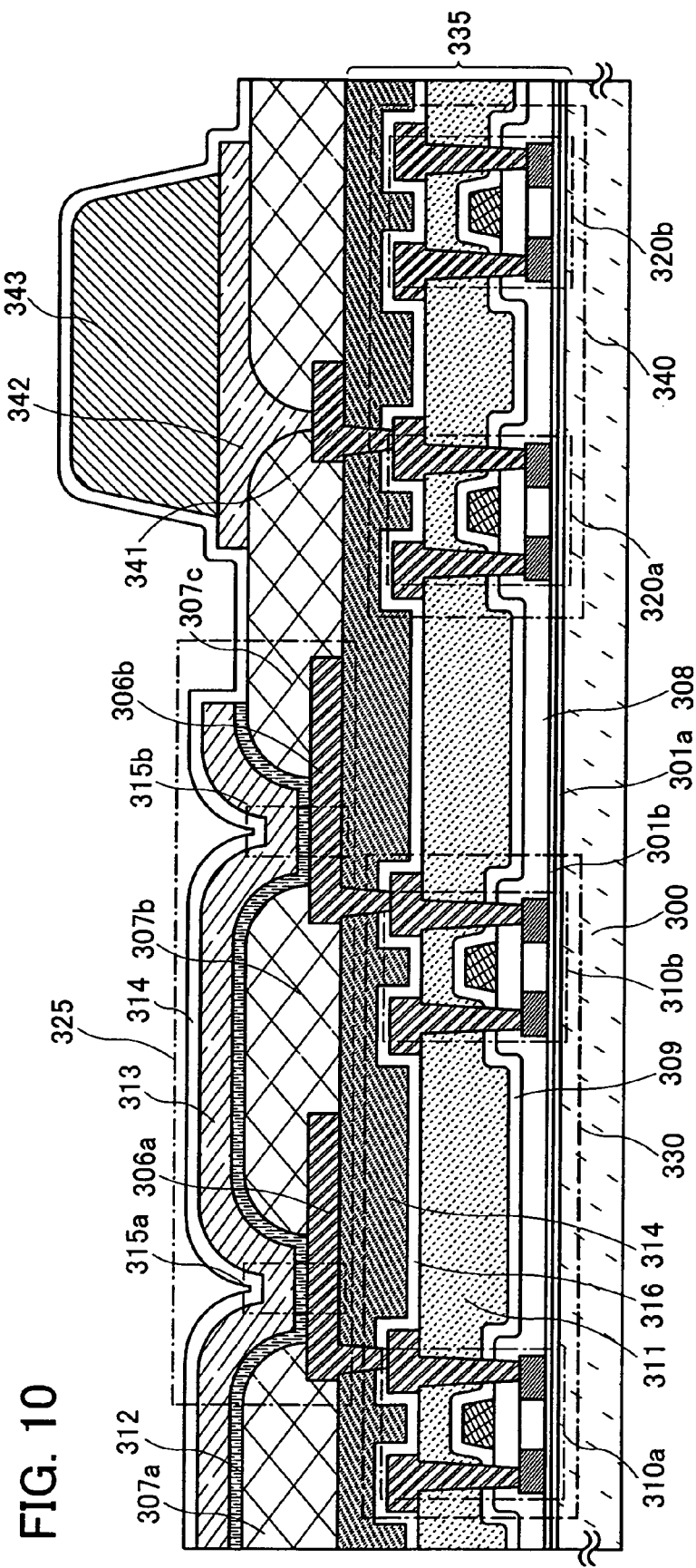
FIG. 10 is a view illustrating a semiconductor device of the present invention.

FIG. 10 shows the semiconductor device of an active matrix type. An element-formation layer 335 which includes a transistor portion 330 having transistors 310a and 310b, a transistor portion 340 having transistors 320a and 320b, and insulating layers 301a, 301b, 308, 311, 316, and 314 is provided over a substrate 300. A memory element portion 325 and a conductive layer 343 serving as an antenna are provided above the element-formation layer 335.

Although the case where the memory element portion 325 or the conductive layer 343 serving as an antenna is provided above the element-formation layer 335 is shown here, the structure is not limited thereto. The memory element portion 325 or the conductive layer 343 serving as an antenna may also be provided below the element-formation layer 335 or in the same layer as the element-formation layer 335.

The memory element portion 325 includes memory elements 315a and 315b. The memory element 315a is formed by stacking an organic compound layer 312 and a second conductive layer 313 over a first conductive layer 306a. The memory element 315b is formed by stacking the organic compound layer 312 and the second conductive layer 313 over a first conductive layer 306b. A partition (an insulating layer) 307a is formed over the first conductive layer 306a, a partition (an insulating layer) 307b is formed over the first conductive layer 306a and the first conductive layer 306b, and a partition (an insulating layer) 307c is formed over the first conductive layer 306b and a conductive layer 341. The insulating layer 314 serving as a protection film is formed to cover the second conductive layer 313. The first conductive layers 306a and 306b for forming the memory elements 315a and 315b are connected to source electrode layers or drain electrode layers of the transistors 310a and 310b, respectively. That is, each memory element is connected to one transistor. In addition, although the organic compound layer 312 which is formed over an entire surface so as to cover the first conductive layers 306a and 306b, and the partitions (insulating layers) 307a, 307b, and 307c here, it may be selectively formed for each memory cell. The memory elements 315a and 315b can be formed using any of the materials and manufacturing methods described in the forgoing embodiment modes.

The memory elements 315a and 315b in FIG. 10 are manufactured to have shapes with a bend or a projection and a depression; therefore, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In the present invention, as a shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

As described in the foregoing embodiment modes, in the memory element 315a, an element having a rectifying property may be provided between the first conductive layer 306a and the organic compound layer 312, or between the organic compound layer 312 and the second conductive layer 313. As the element having a rectifying property, the same as the foregoing element also can be used. The same can be applied to the memory element 315b.

Here, the conductive layer 343 serving as an antenna is provided over a conductive layer 342 formed of the same layer as the second conductive layer 313. Note that the conductive layer serving as an antenna may also be formed of the same layer as the second conductive layer 313.

As a material of the conductive layer 343 serving as an antenna, one kind of elements of gold (Au), platinum (Pt), nickel (Ni), tungsten (W), molybdenum (Mo), cobalt (Co), copper (Cu), aluminum (Al), manganese (Mn), titanium (Ti), or the like an alloy containing a plurality of the foregoing elements, or the like can be used. In addition, as a forming method of the conductive layer 343 serving as an antenna, evaporation, sputtering, CVD, any printing method such as screen printing or gravure printing, a droplet discharge method, or the like can be used.

Any of a p-channel TFT, an n-channel TFT, or a CMOS combining them can be provided as each of the transistors 310a, 310b, 320a, and 320b included in the element-formation layer 335. Further, the semiconductor layer in each of the transistors 310a, 310b, 320a, and 320b can have any structure. For example, an impurity region (including a source region, a drain region, and an LDD region) may be formed or either a p-channel type or an n-channel type may be employed. In addition, an insulating layer (a sidewall) may be formed in contact with a side surface of a gate electrode, or a silicide layer may be formed in one or both of a source region and a drain region and the gate electrode. As a material of the silicide layer, nickel, tungsten, molybdenum, cobalt, platinum, or the like can be used.

Further, an organic transistor in which a semiconductor layer is formed of an organic compound may be provided as each of the transistors 310a, 310b, 320a, and 320b included in the element-formation layer 335. The element-formation layer 335 including an organic transistor can be formed by a printing method, a droplet discharge method, or the like. By forming the element-formation layer 335 by a printing method, a droplet discharge method, or the like, a semiconductor device can be manufactured at lower cost.

The element-formation layer 335, the memory elements 315a and 315b, and the conductive layer 343 serving as an antenna can be formed by evaporation, sputtering, CVD, printing, a droplet discharge method, or the like as described above. In addition, different methods may be used depending on portions. For example, the transistor which requires high-speed operation can be provided by forming a semiconductor layer of Si or the like over a substrate and crystallizing the semiconductor film by heat treatment, and then another transistor serving as a switching element can be provided by a printing method or a droplet discharge method, as an organic transistor above the element-formation layer.

In addition, a sensor connecting to the transistor may be provided. As the sensor, an element which detects properties such as temperature, humidity, illuminance, gas, gravity, pressure, sound (vibration), or acceleration by a physical or chemical means can be given. The sensor is typically formed of a semiconductor element such as a resistor, a capacitive coupling element, an inductive coupling element, a photovoltaic element, a photoelectric conversion element, a thermoelectromotive force element, a transistor, a thermistor, or a diode.

Next, one structural example of the semiconductor device in the case where a terminal portion is provided for a substrate provided with a plurality of elements and memory elements, and an antenna provided over another substrate is connected to the terminal portion is described with reference to FIG. 11.

Figure 11:
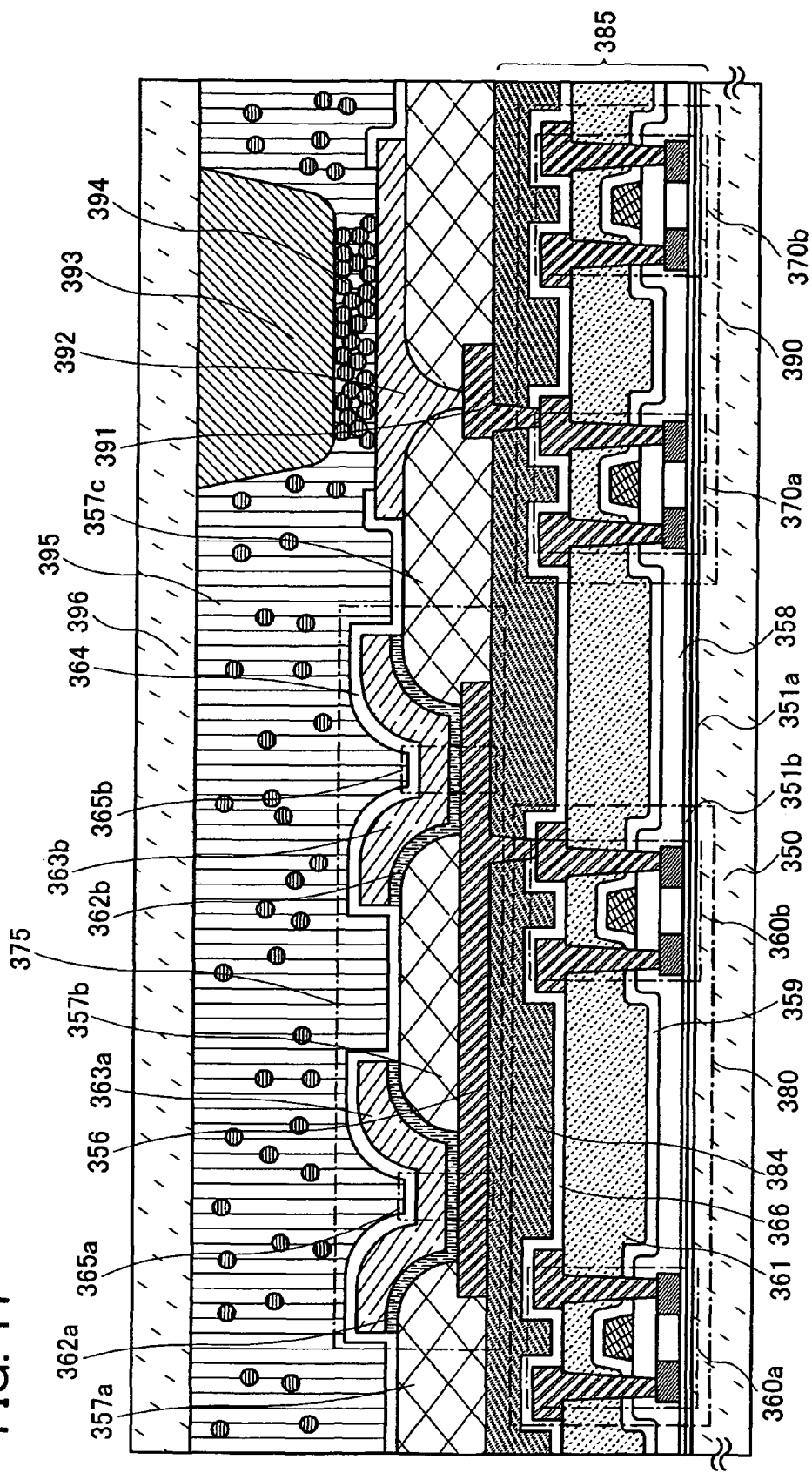
FIG. 11 is a view illustrating a semiconductor device of the present invention.

FIG. 11 shows the semiconductor device of a passive matrix type. An element-formation layer 385 which includes a transistor portion 380 having transistors 360a and 360b, a transistor portion 390 having transistors 370a and 370b, and insulating layers 351a, 351b, 358, 359, 361, 366, and 384 is provided over a substrate 350. A conductive layer 393 serving as an antenna which is formed over a substrate 396 is provided so as to be connected to the element-formation layer 385. Note that although the case where the memory element portion 375 or the conductive layer 393 serving as an antenna is provided above the element-formation layer 385 is shown here, the structure is not limited thereto. The memory element portion 375 may also be provided below the element-formation layer 385 or in the same layer as the element-formation layer 385, or the conductive layer 393 serving as an antenna may also be provided below the element-formation layer 385.

The memory element portion 375 includes memory elements 365a and 365b. The memory element 365a is formed by stacking an organic compound layer 362a and a second conductive layer 363a over a first conductive layer 356. The memory element 365b is formed by stacking an organic compound layer 362b and a second conductive layer 363b over the first conductive layer 356. A partition (insulating layer) 357a and a partition (insulating layer) 357b are formed over the first conductive layer 356 and a partition (insulating layer) 357c is formed over the first conductive layer 356 and a conductive layer 391. An insulating layer 364 serving as a protection film is formed to cover the second conductive layers 363a and 363b. The first conductive layer 356 for forming the memory elements 365a and 365b are connected to source electrode layer or drain electrode layer of one transistor 360b. That is, the memory elements are connected to one transistor. In addition, although the organic compound layer 362a and the second conductive layer 363a are separated from the organic compound layer 362b and the second conductive layer 363b so that each memory cell are separated from one another by providing the partitions (insulating layers) 357a, 357b, and 357c; they may also be formed over an entire surface if there is no fear of influence of electric field in a lateral direction between neighboring memory cells. Note that the memory elements 365a and 365b can be formed using any of the materials and manufacturing methods described in the foregoing embodiment modes.

The memory elements 365a and 365b in FIG. 11 are manufactured to have shapes with a bend or a projection and a depression; therefore, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In the present invention, as a shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

As shown in FIGS. 16A to 16C in Embodiment Mode 1, in this embodiment mode (in the semiconductor devices shown in FIGS. 10 and 11), the insulating layer may be provided between the organic compound layer and the first conductive layer, between the organic compound layer and the second conductive layer, or may be provided both between first conductive layer and the organic compound layer, and between the second conductive layer and the organic compound layer. By providing the insulating layer, characteristics of the memory elements such as writing voltage are stabilized without variation; therefore, normal writing to each element can be carried out. Further, since a carrier injecting property is improved by providing the insulating layer, the thickness of the organic compound layer can be increased. Accordingly, a defect that the memory element is short-circuited in an initial state before electrical conduction can be prevented.

The substrate provided with the element-formation layer 385 and the memory element portion 375 is attached to the substrate 396 provided with the conductive layer 393 serving as an antenna, by an adhesive resin 395. A conductive layer 392 over the element-formation layer 385 and the conductive layer 393 are electrically connected via a conductive fine particle 394 contained in the resin 395. Alternatively, the substrate provided with the element-formation layer 385 and the memory element portion 375 may be attached to the substrate 396 provided with the conductive layer 393 serving as an antenna, by a conductive adhesive such as silver paste, copper paste, or carbon paste, or by solder bonding.

A semiconductor device provided with a memory element and an antenna can be thus formed. Further, in this embodiment mode, an element-formation layer can be provided by forming a thin film transistor over a substrate, or an element-formation layer may be provided by forming a filed-effect transistor over a substrate which is a semiconductor substrate of Si or the like. Alternatively, an SOI substrate may be used as a substrate and an element-formation layer may be provided thereover. In this case, the SOI substrate may be formed by attaching wafers or by using a method called SIMOX in which an insulating layer is formed inside a Si substrate by implanting oxygen ions into the Si substrate.

Further, the memory element portion may also be provided over the substrate provided with the conductive layer serving as an antenna. Further, a sensor connecting to the transistor may also be provided.

Note that this embodiment mode can be implemented by being freely combined with the foregoing embodiment modes. Further, the semiconductor device manufactured in this embodiment mode can be provided over a flexible base by being separated from a substrate in a peeling process and attached to a flexible substrate; whereby a flexible semiconductor device can be formed. The flexible base corresponds to a substrate formed of PET (polyethylene terephthalate), PEN (polyethylene naphthalate), PES (polyethersulfone), polypropylene, polypropylene sulfide, polycarbonate, polyetherimide, polyphenylene sulfide, polyphenylene oxide, polysulfone, polyphthalamide, or the like; a film formed of polypropylene, polyester, vinyl, polyvinyl fluoride, vinyl chloride, or the like; paper formed of a fibrous material; a stacked film of a base material film (such as polyester, polyamide, an inorganic evaporation film, or paper) and an adhesive synthetic resin film (such as an acrylic synthetic resin or an epoxy synthetic resin); or the like. The film is attached to an object by heat treatment and pressure treatment. When heat treatment and pressure treatment are performed to the film, an adhesion layer provided in the outermost surface of the film or a layer provided in the outermost layer (not the adhesion layer) is melted by heat and attached by pressure. The adhesion layer may be provided in the base but not necessarily. The adhesion layer corresponds to a layer containing an adhesive such as a thermosetting resin, an ultraviolet curing resin, an epoxy resin adhesive, or a resin additive.

In the present invention, the memory element may be formed over a first substrate which is resistant to a process condition (such as temperature), and then may be transposed to a second substrate, thereby manufacturing a semiconductor device having the memory element. In this specification, "transposition" is that the memory element formed over the first substrate is separated from the first substrate and transposed to the second substrate; in other words, a place for providing the memory element is moved to another substrate.

A transposition step to another substrate may employ any of the following methods: a method in which a peeling layer and an insulating layer are formed between a substrate and an element-formation layer, a metal oxide film is provided between the peeling layer and the insulating layer, and the metal oxide film is weakened by crystallization, thereby separating the element-formation layer; a method in which an amorphous silicon film containing hydrogen is provided between a substrate having high heat resistance and an element-formation layer, and the amorphous silicon film is irradiated with laser light or etched to be removed, thereby separating the element-formation layer; a method in which a peeling layer and an insulating layer are formed between a substrate and an element-formation layer, a metal oxide film is provided between the peeling layer and the insulating layer, the metal oxide film is weakened by crystallization, a part of the peeling layer is etched and removed using a solution or a halogen fluoride gas such as $NF_3$, $BrF_3$, or $ClF_3$, and separating the element-formation layer by the weakened metal oxide film; a method in which a substrate over which an element-formation layer is formed is mechanically removed or is etched and removed using a solution or a halogen fluoride gas such as $NF_3$, $BrF_3$, or $ClF_3$; or the like. Alternatively, a method in which a film containing nitrogen, oxygen, or hydrogen (such as an amorphous silicon film containing hydrogen, an alloy film containing hydrogen, or an alloy film containing oxygen) is used as a peeling layer, and the peeling layer is irradiated with laser light to release the nitrogen, oxygen, or hydrogen contained therein to promote separation between an element-formation layer and a substrate, may be used.

By combining the foregoing separation methods, the transposing step can be more easily performed. That is, the separation can also be performed with physical force (by a human hand, a machine, or the like) after performing laser light irradiation; etching to the peeling layer with a gas, a solution, or the like; or mechanical removal with a sharp knife, scalpel, or the like; so as to create a condition where the peeling layer and the element-formation layer can be easily separated from each other.

According to the present invention, characteristics of memory elements are stabilized without variation, so that normal writing can be carried out. Therefore, a semiconductor device with improved reliability can be manufactured with a high yield without complicating an apparatus or a process.

Embodiment Mode 5

Figure 14A:
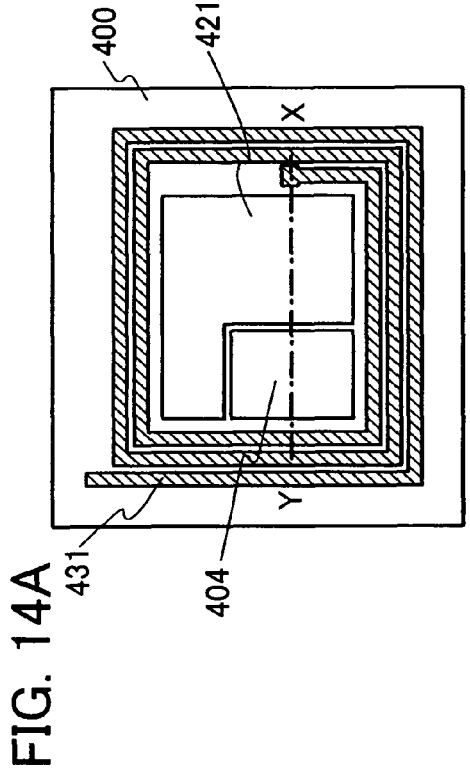
FIGS. 14A and 14B are views illustrating a semiconductor device of the present invention.

In this embodiment mode, an example of the semiconductor device including the memory element described in the foregoing embodiment modes is described with reference to drawings. FIG. 14A is a top view of a semiconductor device of this embodiment mode, and FIG. 14B is a cross-sectional view along a line X-Y in FIG. 14A.

As shown in FIG. 14A, a memory element portion 404 which is a semiconductor device including a memory element, a circuit portion 421, and an antenna 431 are formed over a substrate 400. A state shown in FIGS. 14A and 14B is in process or manufacture, where the memory element portion, the circuit portion, and the antenna are formed over the substrate 400 which is capable of resisting a manufacturing condition. A material and manufacturing process may be selected similarly to those in Embodiment Mode 4.

A peeling layer 452 and an insulating layer 453 are formed over the substrate 400. A transistor 441 and a transistor 442 are provided thereover in the memory element portion 404 and the circuit portion 421, respectively. Insulating layers 461, 454, and 455 are formed over the transistors 441 and 442. A memory element 443 including a first conductive layer 457d, an organic compound layer 458, and a second conductive layer 459 is formed over the insulating layer 455. The organic compound layer 458 is separated individually by an insulating layer 460b serving as a partition. The first conductive layer 457d is connected to a wiring layer of the transistor 441, so that the memory element 443 is electrically connected to the transistor 441.

Figure 14B:
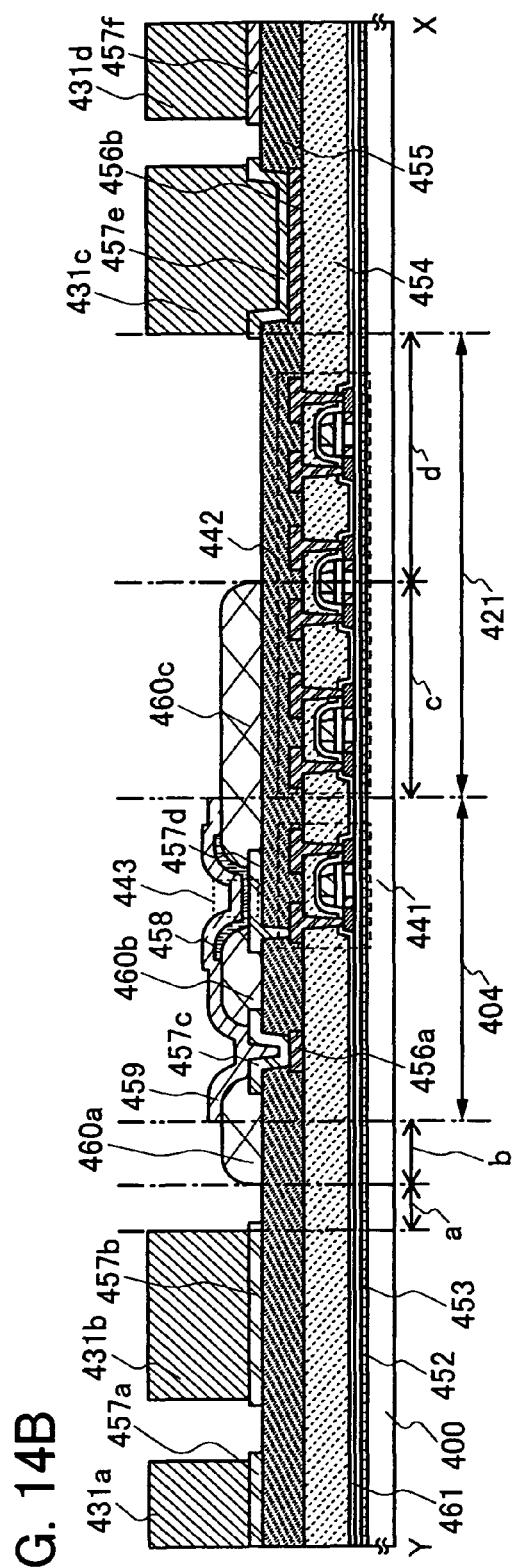
Figure 15A:
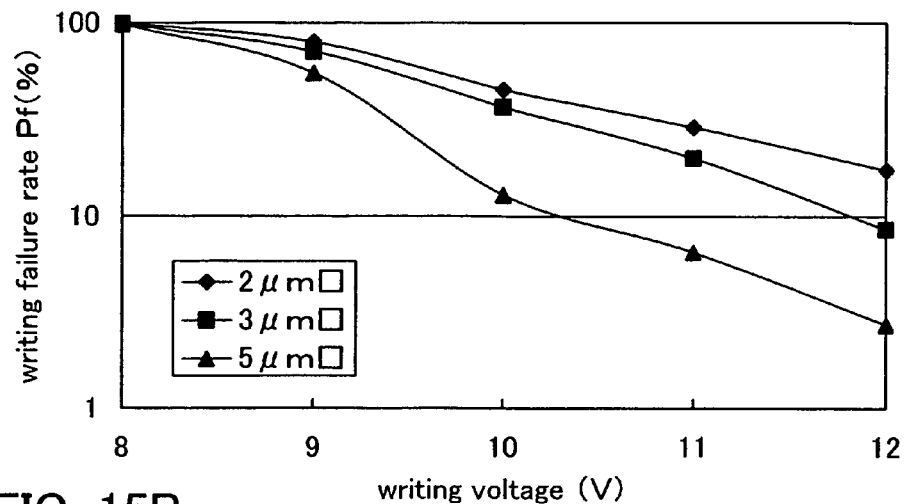
FIGS. 15A to 15C are graphs showing relations between the writing voltage and the writing failure rate of memory elements.
Figure 15B:
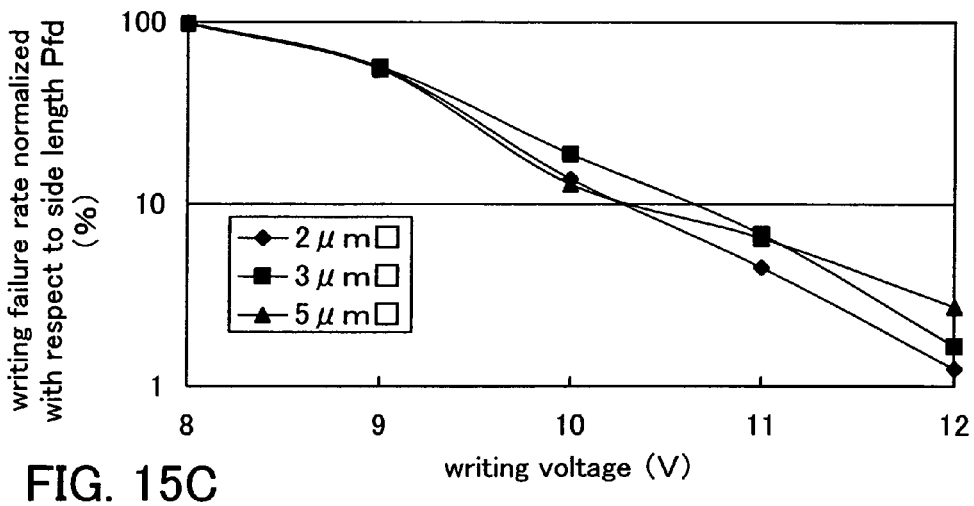
Figure 15C:
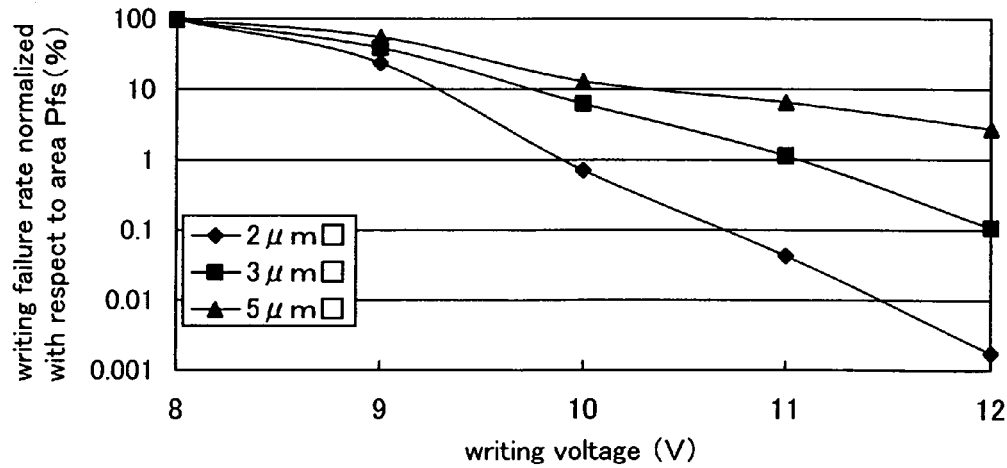

In the semiconductor device shown in FIG. 14B, the second conductive layer 459 is stacked over a wiring layer 456a and a conductive layer 457c so as to be electrically connected to one another. Over the insulating layer 455, stacked-layers of a conductive layer 457a and an antenna 431a, a conductive layer 457b and an antenna 431b, a conductive layer 457e and an antenna 431c, and a conductive layer 457f and an antenna 431d are formed. The conductive layer 457e is formed in contact with a wiring layer 456b in an opening which is formed in the insulating layer 455 and reaches the wiring layer 456b, thereby connecting the antenna to the memory element portion 404 and the circuit portion 421. The conductive layers 457a, 457b, 457e, and 457f under the antennas 431a, 431b, 431c, and 431d improve adhesion between the insulating layer 455 and the antennas 431a, 431b, 431c, and 431d. In this embodiment mode, a polyimide film is used as the insulating layer 455, a titanium film is used as each of the conductive layers 457a, 457b, 457e, and 457f, and an aluminum film is used as each of the antennas 431a, 431b, 431c, and 431d.

Openings (also referred to as contact holes) are formed in the insulating layer 455 so that each of the first conductive layer 457d and the transistor 441, the conductive layer 457c and the wiring layer 456a, and the conductive layer 457e and the wiring layer 456b are connected to each other. Resistance is decreased as the contact area between conductive layers is increased by enlarging the opening. Therefore, the openings in this embodiment mode are set so that the opening for connecting the first conductive layer 457d and the transistor 441 is the smallest, the opening for connecting the conductive layer 457c and the wiring layer 456a follows, and the opening for connecting the conductive layer 457e and the wiring layer 456b is the largest. In this embodiment mode, the opening for connecting the first conductive layer 457d and the transistor 441 is 5 µm×5 µm, the opening for connecting the conductive layer 457c and the wiring layer 456a is 50 µm×50 µm, and the opening for connecting the conductive layer 457e to the wiring layer 456b is 500 µm×500 µm.

In this embodiment mode, a distance a from the insulating layer 460a to the antenna 431b is 500 µm or longer, a distance b from an end of the second conductive layer 459 to an end of the insulating layer 460a is 250 µm or longer, a distance c from an end of the second conductive layer 459 to an end of the insulating layer 460c is 500 µm or longer, and a distance d from the end of the insulating layer 460c to the antenna 431c is 250 µm or longer. The insulating layer 460c is formed partially in the circuit portion 421, and thus, a part of the transistor 442 is covered with the insulating layer 460c and the other part of the transistor 442 is not covered with the insulating layer 460c.

By using such a semiconductor device, a power supply voltage or a signal is inputted directly into the memory element portion 404 from an external input portion, so that data (corresponding to information) can be written into or read from the memory element portion 404.

Further, in the case where a signal is not directly inputted into the external input portion, a power supply and a signal can be generated internally through an RF input portion from an electric wave received by the antenna portion, so that data can be read from the memory element portion 404.

The antenna may be provided either to overlap the memory element portion or to surround the memory element portion without overlapping the memory element portion. In the case of overlapping the memory element portion, the antenna may overlap the memory element portion either entirely or partially. A structure where the antenna portion and the memory element portion are overlapped each other improves reliability since defective operation of a semiconductor device caused by noise or the like in a signal for communication by the antenna, or fluctuation or the like of electromotive force generated by electromagnetic induction can be reduced. Furthermore, the semiconductor device can also be downsized.

As a signal transmission system in the foregoing semiconductor device that is capable of contactless transmitting and receiving data, an electromagnetic coupling system, an electromagnetic induction system, a microwave system, or the like can be used. The transmission system can be appropriately selected considering an intended use, and an optimum antenna may be provided in accordance with the transmission system.

Figure 17A:
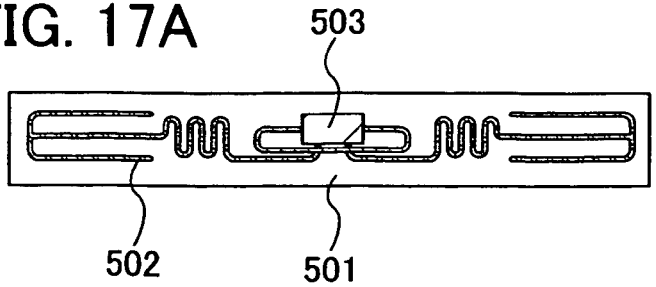
FIGS. 17A to 17D are views illustrating a semiconductor device of the present invention.
Figure 17B:
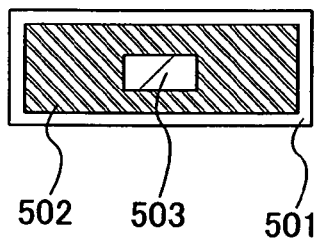
Figure 17C:
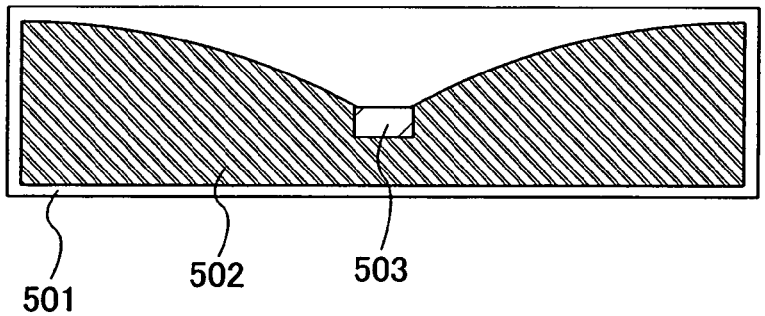

For example, if an electromagnetic coupling system or an electromagnetic induction system (such as a 13.56 MHz band) is employed as the signal transmission system for the semiconductor device, electromagnetic induction caused by change in magnetic field density is utilized; therefore, a conductive layer serving as an antenna is formed into a ring shape (such as a loop antenna) or a spiral shape (such as a spiral antenna). FIGS. 17A to 17C show examples of a conductive layer 502 serving as an antenna and a chip semiconductor device 503 including an integrated circuit which are formed over a substrate 501.

Figure 17D:
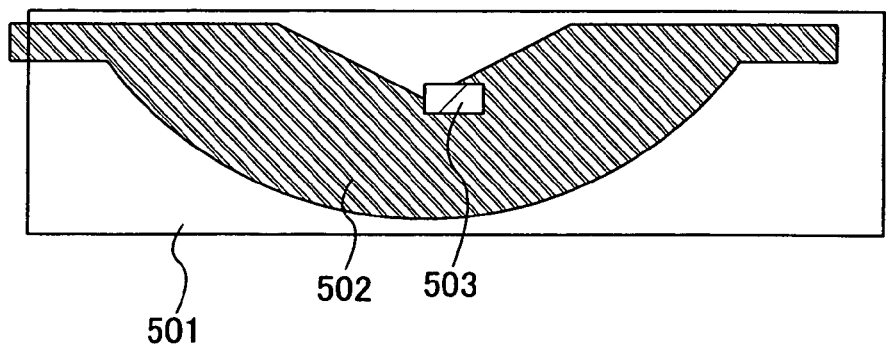

If a microwave system (such as an UHF band (a 860 to 960 MHz band), a 2.45 GHz band, or the like) is used as the signal transmission system for the semiconductor device, the shape such as the length of the conductive layer serving as an antenna may be appropriately set considering the wavelength of an electromagnetic wave used for signal transmission. For example, the conductive layer serving as an antenna can be formed into a linear shape (such as a dipole antenna in FIG. 17A), a flat shape (such as a patch antenna in FIG. 17B), a ribbon shape (FIGS. 17C and 17D), or the like. The shape of the conductive layer serving as an antenna is not limited to a linear shape; the conductive layer serving as an antenna may also be provided in the form of a curve, a meander, or a combination thereof, considering the wavelength of the electromagnetic wave.

The conductive layer serving as an antenna is formed of a conductive material by CVD, sputtering, a printing method such as screen printing or gravure printing, a droplet discharge method, a dispensing method, a plating method, or the like. The conductive layer is formed to have a single-layer structure or a stacked-layer structure of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the foregoing element as its main component.

In the case of forming the conductive layer serving as an antenna by using screen printing, for example, the conductive layer can be provided by selectively printing conductive paste in which conductive particles each having a particle size of several nm to several tens of μm are dissolved or dispersed in an organic resin. As the conductive particle, a metal particle of one or more of silver (Ag), gold (Au), copper (Cu), nickel (Ni), platinum (Pt), palladium (Pd), tantalum (Ta), molybdenum (Mo), and titanium (Ti), or the like, a fine particle of silver halide, or a dispersive nanoparticle can be used. In addition, as the organic resin contained in the conductive paste, one or a plurality of organic resins each serving as a binder, a solvent, a dispersant, or a coating member of the metal particle can be used. Typically, an organic resin such as an epoxy resin or a silicon resin can be used. When forming the conductive layer, baking may be preferably performed after the conductive paste is applied. For example, in the case of using fine particles (such as ones having a size of 1 nm or more and 100 nm or less) containing silver as its main component, as a material of the conductive paste, the conductive layer can be obtained by baking at a temperature of 150 to 300° C. to be cured. Alternatively, fine particles containing solder or lead-free solder as its main component may be used. In this case, it is preferable to use a fine particle having a particle size of 20 μm or less. Solder or lead-free solder has an advantage of low cost. In addition to the foregoing materials, ceramic, ferrite, or the like may be applied to the antenna.

In the case where an electromagnetic coupling system or an electromagnetic induction system is employed and a semiconductor device having an antenna is provided in contact with metal, a magnetic material having magnetic permeability may be preferably provided between the semiconductor device and the metal. If a semiconductor device having an antenna is provided in contact with metal, eddy current flows in the metal in accordance with change in a magnetic field, and a demagnetizing field generated by the eddy current impairs the change in magnetic field to shorten the communication distance. By providing a material having magnetic permeability between the semiconductor device and the metal, eddy current of the metal can be suppressed, thereby suppressing reduction in a communication distance. Note that ferrite or a metal thin film having high magnetic permeability and little loss of high frequency wave can be used as the magnetic material.

Further, when providing an antenna, a semiconductor element such as a transistor and a conductive layer serving as an antenna may be directly formed over one substrate, or a semiconductor element and a conductive layer serving as an antenna may be provided over different substrates and then attached to be electrically connected to each other.

Figure 20A:
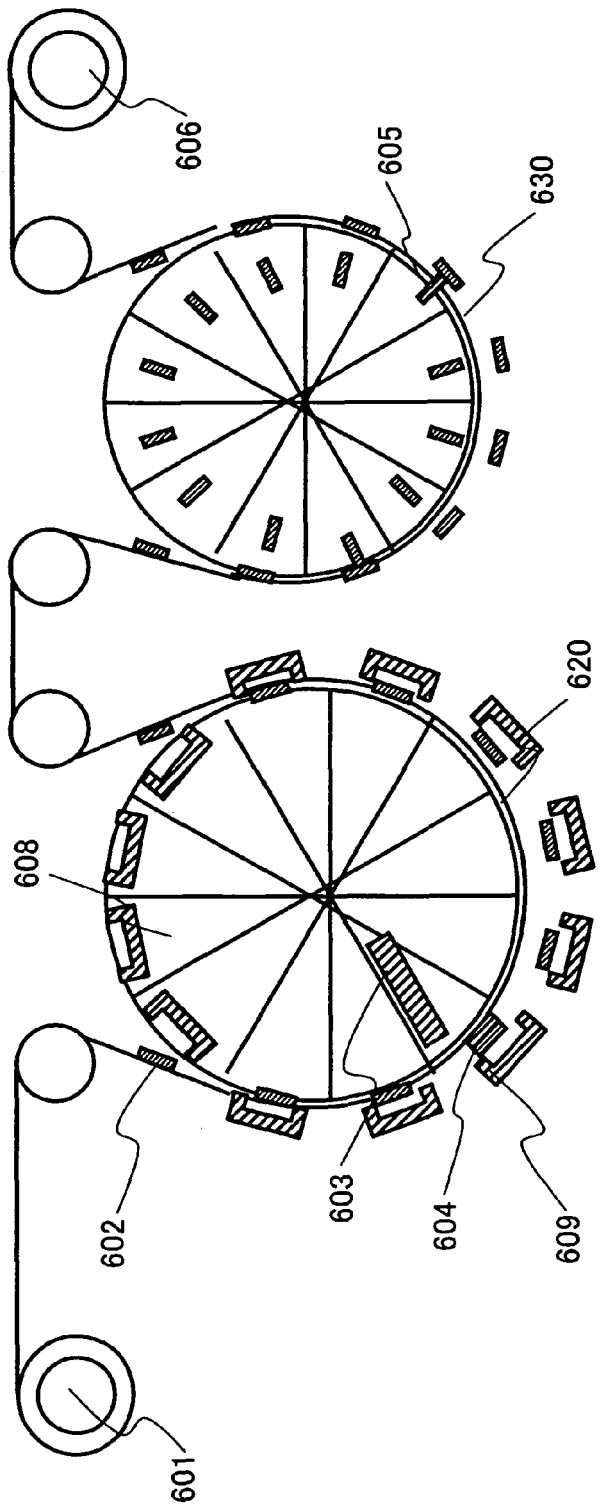
FIGS. 20A and 20B illustrating an examining method of a semiconductor device of the present invention.

A method for examining to evaluate thus manufactured semiconductor device is described with reference to FIGS. 20A and 20B. FIG. 20A shows a system of high speed automatic examination using a roll to roll method for an integrated circuit chip with a built-in antenna (also referred to as RFID (Radio Frequency Identification)) which is formed over a flexible substrate such as a film. An integrated circuit chip in an integrated circuit chip with a built-in antenna includes a memory element with a bend or a projection and a depression on the periphery as shown in foregoing embodiment modes.

Figure 20B:
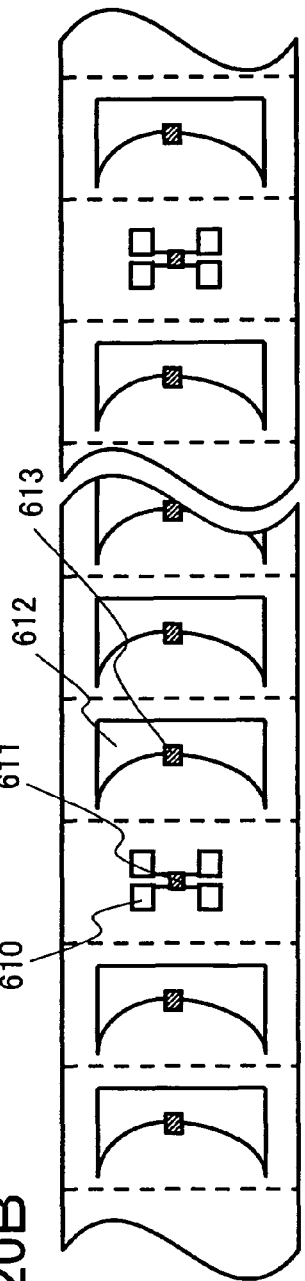

In the examination system shown in FIGS. 20A and 20B, reference numeral 601 denotes a sending roll; 603, a circuit for measuring a signal; a 604, antenna for measuring a signal; 609, a movable shield; 620, a rotating chamber mechanism drum having a plurality of slots 608; 630, a rotating probe mechanism drum; 605, a movable prove; and 606, receiving roll. An integrated circuit chip with a built-in antenna 602, which is an object of examination, is carried by a roll. The rotating chamber mechanism drum 620 is for examination of the integrated circuit chip with a built-in antenna and conducts the measuring examination of the integrated circuit chip with a built-in antenna in a non-contact manner. FIG. 20B shows a top view of the integrated circuit chip with a built-in antenna being carried on the roll, in which a TEG chip 611, a pad for examination 610, an antenna 612, and an integrated circuit chip 613 are carried. The rotating probe mechanism drum 630 measures and evaluates electrical characteristics of a transistor and LCR characteristics (inductance, capacitance, and resistance) in the integrated circuit chip by making the movable prove be in contact with the TEG chip manufactured using the same substrate and through the same process as the integrated circuit chip. In this manner, a semiconductor device to which the present invention is applied can be automatically examined at high-speed.

The memory element 443 in FIGS. 14A and 14B are manufactured to have shapes with a bend or a projection and a depression; therefore, a perimeter of the memory element is long. Considering a rectangle having the same area as such a memory element, the longer its perimeter is, the higher a ratio of a long side to a short side becomes. In the present invention, the ratio of a long side to a short side is preferably 3 or more, and more preferably, 6 or more. In addition, considering a square having the same perimeter as the memory element in this embodiment mode, an area of the square is larger than that of the memory element in this embodiment mode. In the present invention, a ratio of the area of the memory element to the area of the square is preferably 0.75 or less, and more preferably, 0.5 or less.

In the present invention, as a shape of a memory element, a rectangular shape having a projection and a depression on the periphery, a zigzagged shape having one or plural bends, a comb shape, a ring shape having an opening (space) inside, or the like is used. Alternatively, a rectangle with a ratio of a long side to a short side being high, an ellipse with a ratio of a long axis to a short axis being high, or the like can also be used.

In such a memory element as in this embodiment mode, normal writing can be carried out and a writing failure rate can be decreased. In addition, in a plurality of memory elements, writing characteristics are stabilized without variation. Therefore, a semiconductor device with improved reliability in writing can be manufactured by using such a memory element.

According to the present invention, characteristics of memory elements are stabilized without variation, so that normal writing can be carried out. Therefore, a semiconductor device with improved reliability can be manufactured with a high yield without complicating an apparatus or a process.

Embodiment Mode 6

In this embodiment mode, reading and writing of data in a semiconductor device having the foregoing structure is described.

First, operation when data writing is performed to a memory element in a semiconductor device of a passive matrix type is described with reference to FIGS. 2A to 2C and 3A to 3C. Data writing can be performed by electrical action or by both electrical action and optical action. Described first is the case where data writing is performed by electrical action (FIGS. 3A to 3C). Note that the writing is performed by changing electrical characteristics of a memory cell, and an initial state (a state before electrical action is applied) of the memory cell is denoted by data "0", while the state after the electrical characteristics are changed is denoted by data "1".

In the case of writing data "1" to the memory cell 721, the memory cell 721 is selected by the decoders 723 and 724 and a selector 725 first. Specifically, a predetermined voltage V2 is applied by the decoder 724 to a word line W3 connected to the memory cell 721. A bit line B3 connected to the memory cell 721 is connected to the circuit 726 by the decoder 723 and the selector 725. Then, a writing voltage V1 is outputted from the circuit 726 to the bit line B3. In this manner, a voltage Vw=V1−V2 is applied between the first conductive layer and the second conductive layer included in the memory cell 721. By selecting the potential Vw appropriately, the organic compound layer between the conductive layers can be changed physically or electrically, whereby data "1" is written. Specifically, the electrical resistance between the first conductive layer and the second conductive layer in the state of data "1" at the reading operation voltage may be changed so as to be much smaller than that in the state of data "0". For example, the voltages may be selected appropriately within the range of (V1, V2)=(0 V, 5 to 15 V) or (3 to 5 V, −12 to −2 V). The voltage Vw may be in the range of 5 to 15 V or −15 to −5 V.

Note that unselected word lines and bit lines are controlled so that data "1" is not written in memory cells connected thereto. For example, the unselected word and bit lines may be made into a floating state. A property such as a diode property is needed for securing selectivity between the first conductive layer and the second conductive layer in each memory cell.

On the other hand, in the case of writing data "0" to the memory cell 721, electrical action is not applied to the memory cell 721. As circuit operation, for example, the memory cell 721 is selected by the decoders 723 and 724 and the selector 725, similarly to the case of writing data "1"; however, an output potential from the circuit 726 to the bit line B3 is set to be similar to the potential of the selected word line W3 or the potential of an unselected word line, so that voltage (for example, −5 to 5 V) within the range where the electrical characteristics of the memory cell 721 is not changed is applied between the first conductive layer and the second conductive layer in the memory cell 721.

Figure 19A:
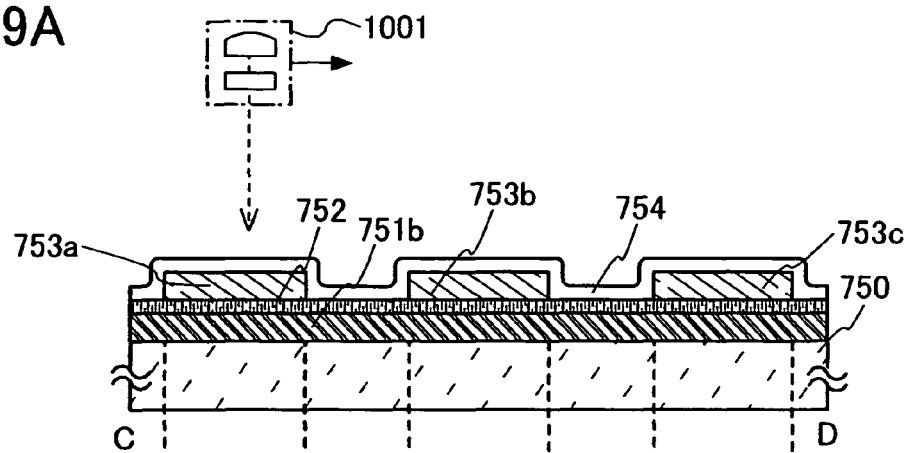
FIGS. 19A to 19C are views illustrating a semiconductor device of the present invention.
Figure 19B:
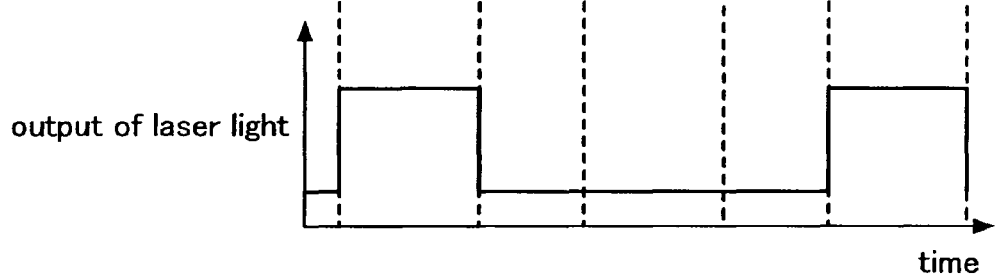
Figure 19C:
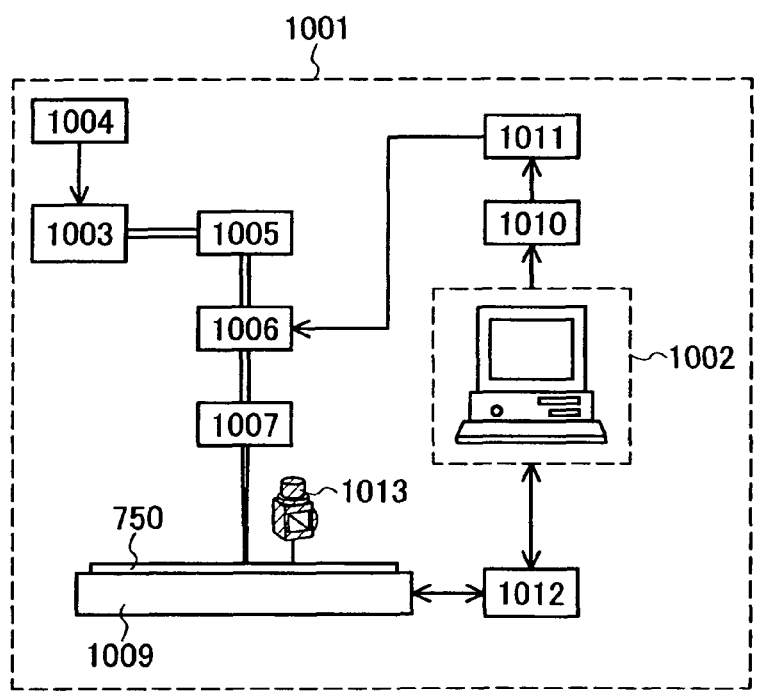

Data can be written to the memory element by optical action, as well as by electrical action. Described next is the case where data writing is performed by optical action (FIGS. 19A to 19C). Here, it is necessary that the second conductive layer 753a transmits laser light. Data is written by irradiating the organic compound layer 752 with laser light from a side of a conductive layer having a light-transmitting property (the second conductive layer 753a here). Here, the organic compound layer 752 is damaged (or broken in some cases) by being selectively irradiated a desired part of the organic compound layer 752 with laser light. The damaged organic compound layer is insulated, thereby having much larger resistance than the other portion. In this manner, by utilizing the change in electrical resistance between the two conductive layers provided with the organic compound layer 752 interposed therebetween by laser light irradiation, data is written. For example, if data of the organic compound layer to which no laser light irradiation is performed is assumed to be "0", the electrical resistance is increased by selectively irradiating a desired part of the organic compound layer with laser light and damaging the organic compound layer when data of "1" is written.

Further, in the case where a conjugated polymer doped with a compound (a photoacid generator) which generates acid by absorbing light is used for the organic compound layer 752, when the organic compound layer 752 is irradiated with laser light, the conductivity is increased only in the irradiated part of the organic compound layer 752 whereas the non-irradiated part thereof does not have conductivity. Accordingly, data is written utilizing the change in electrical resistance of the organic compound layer by selectively irradiating a desired part of the organic compound layer with laser light. For example, in the case where data of the organic compound layer to which no laser light irradiation is performed is assumed to be "0", the conductivity is increased by selectively irradiating a desired part of the organic compound layer with laser light when data of "1" is written.

In the case of laser light irradiation, the change in electrical resistance of the organic compound layer 752 is realized by laser light irradiation with a beam spot narrowed down to a diameter of μm size, though it depends on the size of the memory cell 721. For example, when a laser beam with a diameter of 1 μm passes at a linear velocity of 10 m/sec, the time for which the organic compound layer included in each memory cell is irradiated with the laser light, is 100 nsec. In order to change the phase within the time as short as 100 nsec, laser power may be 10 mW and power density may be 10 kW/mm$^2$. Furthermore, in the case of selectively irradiating the organic compound layer 752 with laser light, a pulsed laser irradiation apparatus is preferably used.

Here, an example of a laser irradiation apparatus is briefly described with reference to FIG. 19C. A laser irradiation apparatus 1001 is equipped with a computer (hereinafter referred to as a PC) 1002 which carries out various controls at laser light irradiation; a laser oscillator 1003 which outputs laser light; a power supply 1004 of the laser oscillator 1003; an optical system (an ND filter) 1005 for attenuating laser light; an acousto-optic modulator (AOM) 1006 for modulating the intensity of laser light; an optical system 1007 which includes a lens for condensing a cross-section of laser light, a mirror for changing an optical path, and the like; a movement mechanism 1009 having an x-axis stage and a y-axis stage; a D/A converter portion 1010 for digital-analog conversion of a control data outputted from the PC; a driver 1011 which controls the acousto-optic modulator 1006 in accordance with an analog voltage outputted from the D/A converter portion; a driver 1012 which outputs a driving signal for driving the movement mechanism 1009; and an auto-focus mechanism 1013 for focusing laser light on an object to be irradiated (FIG. 19C).

As the laser oscillator 1003, a laser oscillator which is capable of oscillating ultraviolet light, visible light, or infrared light can be used. As the laser oscillator, an excimer laser oscillator of KrF, ArF, XeCl, Xe, or the like; a gas laser oscillator of He, He—Cd, Ar, He—Ne, HF, or the like; a solid-state laser oscillator using a crystal of YAG, GdVO$_4$, YVO$_4$, YLF, YAlO$_3$ or the like doped with Cr, Nd, Er, Ho, Ce, Co, Ti, or Tm; or a semiconductor laser oscillator of GaN, GaAs, GaAlAs, InGaAsP, or the like can be used. As for the solid-state laser oscillator, the fundamental wave or the second to the fifth harmonic is preferably employed.

Next, an irradiation method using the laser irradiation apparatus is described. When the substrate provided with the organic compound layer is placed in the movement mechanism 1009, the PC 1002 detects a position of the organic compound layer which is to be irradiated with laser light, with a camera which is not shown. Subsequently, based on the detected positional data, the PC 1002 generates movement data for moving the movement mechanism 1009.

Subsequently, the PC 1002 controls the amount of output light of the acousto-optic modulator 1006 via the driver 1011, whereby laser light outputted from the laser oscillator 1003 is attenuated by the optical system 1005 and then the light amount thereof is controlled by the acousto-optic modulator 1006 so as to be a predetermined light amount. The laser light outputted from the acousto-optic modulator 1006 changes its optical path and its beam spot shape with the optical system 1007, and is condensed by the lens, and then, emitted to the substrate 750.

At this time, the movement mechanism 1009 is controlled to move in an x direction and a y direction in accordance with the movement data generated by the PC 1002. As a result, a predetermined position is irradiated with laser light, the light energy density of laser light is converted to heat energy, and the organic compound layer provided over the substrate 750 can be selectively irradiated with laser light. Note that although the case where laser light irradiation is performed by moving the movement mechanism 1009 is described here, laser light may also be moved in the x direction and the y direction by adjusting the optical system 1007.

According to a structure of the present invention in which data writing is performed by laser light irradiation as described above, a semiconductor device can be manufactured easily and in large quantity. Accordingly, a semiconductor device can be provided at low cost.

Next, operation when data reading is performed from the memory element in the semiconductor device of a passive matrix type is described (FIGS. 3A to 3C). The data reading is performed by utilizing a phenomenon that the electrical characteristics between the first conductive layer and the second conductive layer for forming each memory cell differ between a memory cell having data "0" and a memory cell having data "1". For example, in the case where the effective electrical resistance between the first conductive layer and the second conductive layer in each memory cell (hereinafter simply referred to as the electrical resistance of each memory cell) having data "0" is R0 at a reading voltage whereas the electrical resistance of each memory cell having data "1" is R1 at the reading voltage, a method of reading data by utilizing the difference in electrical resistance is described. Note that R1<<R0 is satisfied. In the reading circuit, for example, the circuit 726 using a resistor 746 and a differential amplifier 747 shown in FIG. 3B can be considered to be included in a reading portion. It is assumed that the resistor 746 has a resistance value Rr, and R1<Rr<R0 is satisfied. A transistor 748 may be used instead of the resistor 746 and a clocked inverter 749 can be used instead of the differential amplifier (FIG. 3C). A signal φ or an inverted signal φ which is High in the case of reading and is Low in the case of not reading is inputted into the clocked inverter 749. Needless to say, the circuit structure is not limited to those in FIGS. 3A to 3C.

When data is read from the memory cell 721, the memory cell 721 is selected by the decoders 723 and 724 and the selector 725 first. Specifically, a predetermined voltage Vy is applied by the decoder 724 to a word line Wy connected to the memory cell 721. A bit line Bx connected to the memory cell 721 is connected to a terminal P of the circuit 726 by the decoder 723 and the selector 725. As a result, a potential Vp of the terminal P is determined by resistance division by a resistor 746 (a resistance value Rr) and the memory cell 721 (a resistance value R0 or R1). Therefore, in the case where the memory cell 721 has data "0", Vp0=Vy+(V0−Vy)×R0/(R0+Rr) is satisfied; in the case where the memory cell 721 has data "1", Vp1=Vy+(V0−Vy)×R1/(R1+Rr) is satisfied. Accordingly, Vref is selected so as to be between Vp0 and Vp1 in FIG. 3B, and the point of change of the clocked inverter is selected so as to be between Vp0 and Vp1 in FIG. 3C, so that Low or High (or High or Low) is outputted as an output potential Vout in accordance with data "0" or "1", whereby data reading can be performed.

For example, the differential amplifier is operated at Vdd=3 V, so that Vy=0 V, V0=3 V, and Vref=1.5 V are satisfied. If R0/Rr=Rr/R1=9 is satisfied; when data of the memory cell is "0", Vp0=2.7 V is satisfied and High is outputted as Vout, while when data of the memory cell is "1", Vp1=0.3 V is satisfied and Low is outputted as Vout. In this manner, data reading from the memory cell can be performed.

In the above method, the electrical resistance of the organic compound layer 752 is read by a voltage value by utilizing the resistance division and the difference in resistance value. Needless to say, the reading method is not limited to this. For example, instead of utilizing the difference in electrical resistance, difference in a current value may also be utilized to read data. Further, in the case where the electrical characteristics of the memory cell have a diode characteristic in which threshold voltage is different between the cases where data is "0" and "1", data may also be read utilizing difference in the threshold voltage.

Next, operation when data writing is performed to a memory element in a semiconductor device of an active matrix type is described (FIGS. 4A and 4B, and 5A to 5C).

Described first is the case where data writing is performed by electrical action. Note that the writing is performed by changing electrical characteristics of a memory cell; and an initial state (a state before electrical action is applied) of the memory cell is denoted by data "0", while the state after the electrical characteristics are changed is denoted by data "1".

Described here is the case where data is written into the memory cell 231 in the n-th row and the m-th column. In the case of writing data "1" to the memory cell 231, the memory cell 231 is selected by the decoders 223 and 224 and a selector 225 first. Specifically, a predetermined voltage V22 is applied by the decoder 224 to a word line Wn connected to the memory cell 231. A bit line Bm connected to the memory cell 231 is connected to the circuit 226 including a reading circuit and a writing circuit by the decoder 223 and the selector 225. Here, m is 3. A writing voltage V21 is outputted from the circuit 226 to the bit line B3.

Thus, the transistor 210a in the memory cell is turned on and the memory element 215b is electrically connected to the bit line, and then a voltage of approximately Vw=Vcom−V21 is applied. Note that one electrode of the memory element 231 is connected to a common electrode having a potential Vcom. By selecting the potential Vw appropriately, an organic compound layer provided between conductive layers is changed physically or electrically, whereby data "1" is written. Specifically, the electrical resistance between the first conductive layer and the second conductive layer in the state of data "1" at a reading operation voltage may be changed so as to be much smaller than that in the state of data "0". Alternatively, they may be simply short-circuited. Note that the potentials may be selected appropriately within the range of (V21, V22, Vcom)=(5 to 15 V, 5 to 15 V, 0 V) or (−12 to 0 V, −12 to 0 V, 3 to 5V). The voltage Vw may be in the range of 5 to 15 V or −15 to −5 V.

Note that unselected word lines and bit lines are controlled so that data "1" is not written in memory cells connected thereto. For example, a potential (for example, 0 V) for turning off the transistor of each memory cell may be applied to the unselected word lines connected to the memory cell so as to make the unselected bit lines into a floating state, or a potential which is approximately equal to Vcom may be applied.

On the other hand, in the case of writing data "0" into the memory cell 231, electrical action is not applied to the memory cell 231. As circuit operation, for example, the memory cell 231 is selected by the decoders 223 and 224 and the selector 225, similarly to the case of writing data "1"; however, the output potential from the circuit 226 to the bit line B3 is set to be the same degree as Vcom or the bit line B3 is made into a floating state. Consequently, a low voltage (for example, −5 to 5 V) or no voltage is applied to the memory element 215b so that the electrical characteristics are not changed, whereby data "0" is written.

Described next is the case where data is written by optical action. In this case, data is written by irradiating the organic compound layer with laser light from a side of a conductive layer having a light-transmitting property, using a laser irradiation apparatus. An apparatus similar to that described to be used for the passive matrix type semiconductor device with reference to FIGS. 19A to 19C may be used as the laser irradiation apparatus.

In the case where an organic compound material is used as the organic compound layer, the organic compound layer is damaged to be oxidized or carbonized and insulated by laser light irradiation. Thus, a resistance value of a memory element that is irradiated with laser light is increased, while the resistance value of a memory element that is not irradiated with laser light is not changed. In the case where a conjugated polymer material doped with a photoacid generator is used, the organic compound layer becomes conductive by laser light irradiation. That is, the memory element that is irradiated with laser light becomes conductive, whereas the memory element that is not irradiated with laser light does not become conductive.

Next, operation when data is read by electrical action is described. Here, the circuit 226 has a structure including a resistor 246 and a differential amplifier 247; however, the structure of the circuit 226 is not limited to this, and any structure may be employed.

Operation when data reading is performed by electrical action in the semiconductor device of an active matrix type is described. The data reading is performed by utilizing a phenomenon that the electrical characteristics of the memory element 215b differs between a memory cell having data "0" and a memory cell having data "1". For example, in the case where the electrical resistance of the memory element in each memory cell having data "0" is R0 at a reading voltage whereas the electrical resistance of the memory element in each memory cell having data "1" is R1 at the reading voltage, a method of reading data by utilizing the difference in electrical resistance is described. Note that R1<<R0 is satisfied. In the reading circuit, for example, the circuit 226 using the resistor 246 and the differential amplifier 247 shown in FIG. 5B can be considered to be included in a reading portion. It is assumed that the resistor has a resistance value Rr, and R1<Rr<R0 is satisfied. A transistor 249 may be used instead of the resistor 246 and a clocked inverter 248 can be used instead of the differential amplifier (FIG. 5C). Needless to say, the circuit structure is not limited to those in FIGS. 5A to 5C.

When data is read from the memory cell 231 in the x-th row and the y-th column, the memory cell 231 is selected by the decoders 223 and 224 and the selector 225 first. Specifically, a predetermined voltage V24 is applied by the decoder 224 to the word line Wy connected to the memory cell 231 to turn on the transistor 210a. The bit line Bx connected to the memory cell 231 is connected to a terminal P of the circuit 226 by the decoder 223 and the selector 225. As a result, a potential Vp of the terminal P is determined by resistance division by the resistor 246 (a resistance value Rr) and the memory cell 215b (a resistance value R0 or R1). Therefore, in the case where the memory cell 231 has data "0", Vp0=Vcom+(V0−Vcom)×R0/(R0+Rr) is satisfied; in the case where the memory cell 231 has data "1", Vp1=Vcom+(V0−Vcom)×R1/(R1+Rr) is satisfied. Accordingly, Vref is selected so as to be between Vp0 and Vp1 in FIG. 5B, whereas the point of change of the clocked inverter is selected so as to be between Vp0 and Vp1 in FIG. 5C, so that Low or High (or High or Low) is outputted as an output potential Vout in accordance with the data "0" or "1", whereby data reading can be performed.

For example, the differential amplifier is operated at Vdd=3 V, so that Vcom=0 V, V0=3 V, and Vref=1.5 V are satisfied. If R0/Rr=Rr/R1=9 is satisfied and the on-resistance of the transistor 210a is not required to be considered; when data of the memory cell is "0", Vp0=2.7 V is satisfied and High is outputted as Vout, while when data of the memory cell is "1", Vp1=0.3 V is satisfied and Low is outputted as Vout. In this manner, data reading from the memory cell can be performed.

In the above method, data is read by a voltage value by utilizing the resistance division and the difference in resistance value of the memory element 215b. Needless to say, the reading method is not limited to this. For example, instead of utilizing the difference in electrical resistance, difference in a current value may also be utilized to read data. Further, in the case where the electrical characteristics of the memory cell have a diode characteristic in which threshold voltage is different between the cases where data is "0" and "1", data may also be read utilizing difference in the threshold voltage.

Each of the memory element and the semiconductor device provided with the memory element having the foregoing structure is a nonvolatile memory; therefore, it is not necessary to incorporate a battery for storing data, so that a small, thin, and light-weight semiconductor device can be provided. Moreover, by using the insulating material used in the above embodiment modes as an organic compound layer, data can be written (added), but rewriting of data can not be performed; accordingly, forgery is prevented and a semiconductor device with ensured security can be provided.

Note that this embodiment mode can be implemented by being freely combined with the structure of the memory element and the semiconductor device having the memory element described in the foregoing embodiment modes.

Embodiment Mode 7

Figure 12A:
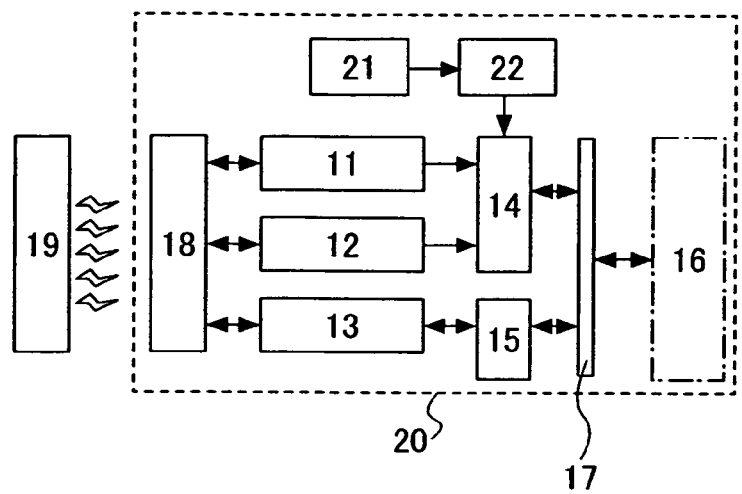
FIGS. 12A and 12B are views illustrating a semiconductor device of the present invention.

A structure of a semiconductor device of this embodiment mode is described with reference to FIG. 12A. As shown in FIG. 12A, a semiconductor device 20 of the present invention has a function of communicating data without contact. The semiconductor device 20 includes a power supply circuit 11, a clock generating circuit 12, a data modulating/demodulating circuit 13, a controlling circuit 14 for controlling another circuit, an interface circuit 15, a memory circuit 16, a data bus 17, and an antenna (an antenna coil) 18, a sensor 21, and a sensor circuit 22.

The power supply circuit 11 is a circuit generating various power supplies to be supplied to the respective circuits in the semiconductor device 20, based on an alternating signal inputted from the antenna 18. The clock generating circuit 12 is a circuit generating various clock signals which are supplied to each circuit in the semiconductor device 20, based on an alternating signal inputted from the antenna 18. The data modulating/demodulating circuit 13 has a function of demodulating/modulating data which is exchanged with a reader/writer 19. The controlling circuit 14 has a function of controlling the memory circuit 16. The antenna 18 has a function of sending/receiving an electromagnetic field or a radio wave. The reader/writer 19 has a function of communicating with the semiconductor device, controlling the semiconductor device, and processing data thereof. Note that the structure of the semiconductor device is not limited to the foregoing structure and may have an additional element such as a limiter circuit of a power source voltage or a hardware for processing a code.

The memory circuit 16 includes a memory element in which an organic compound layer or a phase-change layer is interposed between a pair of conductive layers. The memory element 16 may include only the memory element in which an organic compound layer or a phase-change layer is interposed between a pair of conductive layers or include a memory circuit having another structure. The memory circuit having another structure corresponds to, for example, one or a plurality of the following: a DRAM, an SRAM, a FeRAM, a mask ROM, a PROM, an EPROM, an EEPROM, and a flash memory.

The sensor 21 includes a semiconductor element such as a resistor, a capacitive coupling element, an inductive coupling element, a photovoltaic element, a photoelectric conversion element, a thermo-electromotive force element, a transistor, a thermistor, or a diode. The sensor circuit 22 detects a change of impedance, reactance, inductance, voltage, or current and analog/digital converts them (A/D conversion), so that a signal is outputted to the controlling circuit 14.

Embodiment Mode 8

According to the present invention, a semiconductor device serving as a chip having a processor circuit (hereinafter also referred to as a processor chip, a wireless chip, a wireless processor, a wireless memory, or a wireless tag) can be formed. The application range of the semiconductor device of the present invention is wide. For example, the semiconductor device of the present invention can be used by being provided for bills, coins, securities, certificates, bearer bonds, packing containers, documents, recording media, personal belongings, vehicles, food, clothing, health products, commodities, medicine, electronic appliances, or the like.

Figure 13A:
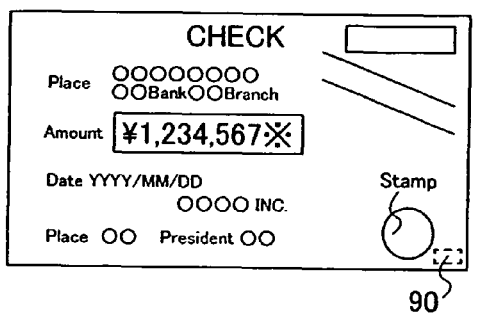
FIGS. 13A to 13G are views illustrating a semiconductor device of the present invention.
Figure 13B:
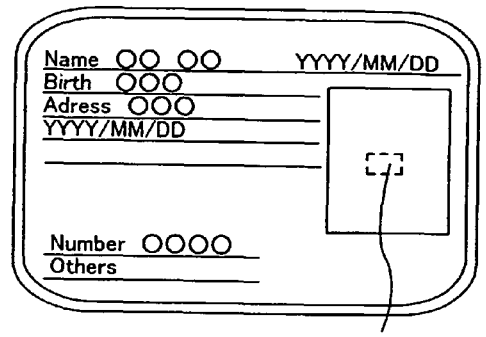
Figure 13C:
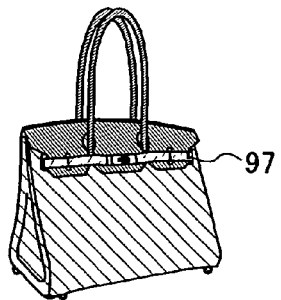
Figure 13D:
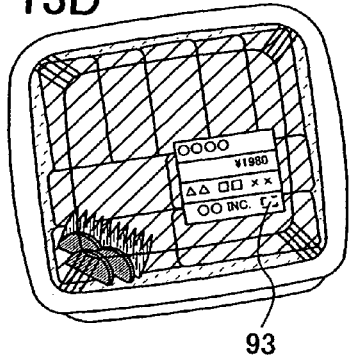
Figure 13E:
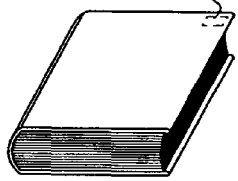
Figure 13F:
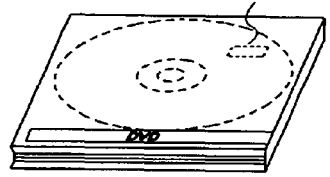
Figure 13G:
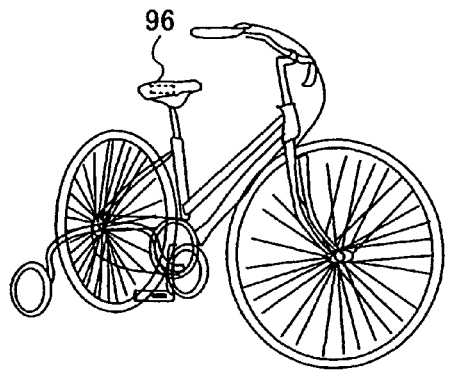

Paper money and coins are money circulating in the market and include ones valid in a certain area similarly to currency (cash vouchers), commemorative coins, and the like. Securities refer to checks, certificates, promissory notes, and the like, and can be provided with a chip 90 having a processor circuit (FIG. 13A). Certificates refer to driver's licenses, certificates of residence, and the like, and can be provided with a chip 91 having a processor circuit (FIG. 13B). Personal belongings refer to bags, glasses, and the like, and can be provided with a chip 97 having a processor circuit (FIG. 13C). Bearer bonds refer to stamps, rice coupons, various gift certificates, and the like. Packing containers refer to wrapping paper for box lunches and the like, plastic bottles, and the like, and can be provided with a chip 93 having a processor circuit (FIG. 13D). Documents refer to books and the like, and can be provided with a chip 94 having a processor circuit (FIG. 13E). Recording media refer to DVD software, video tapes, and the like, and can be provided with a chip 95 having a processor circuit (FIG. 13F). Vehicles refer to wheeled vehicles such as bicycles, ships, and the like, and can be provided with a chip 96 having a processor circuit (FIG. 13G). Food refers to food articles, drink, and the like. Clothing refers to clothes, footwear, and the like. Health products refer to medical instruments, health instruments, and the like. Commodities refer to furniture, lighting equipment, and the like. Medicine refers to medical products, pesticides, and the like. Electronic appliances refer to liquid crystal display devices, EL display devices, television devices (TV sets or thin TV sets), mobile phones, and the like.

The semiconductor device of the present invention is fixed to an article by being mounted onto a printed-wiring board, by being attached to a surface of the article, or by being embedded in the article. For example, in the case of a book, the semiconductor device may be embedded in paper thereof to be fixed; in the case of a package made from an organic resin, the semiconductor device may be embedded in the organic resin to be fixed. The semiconductor device of the present invention which is small and thin size and light weight does not damage the design of an article itself even after being fixed to the article. By providing the semiconductor device of the present invention for bills, coins, securities, certificates, bearer bonds, or the like, an identification function can be provided, and forgery can be prevented by utilizing this identification function. Further, efficiency of a system such as an inspection system can be improved by providing the semiconductor device of the present invention for packing containers, recording media, personal belongings, food, clothing, commodities, electronic appliances, and the like.

Figure 12B:
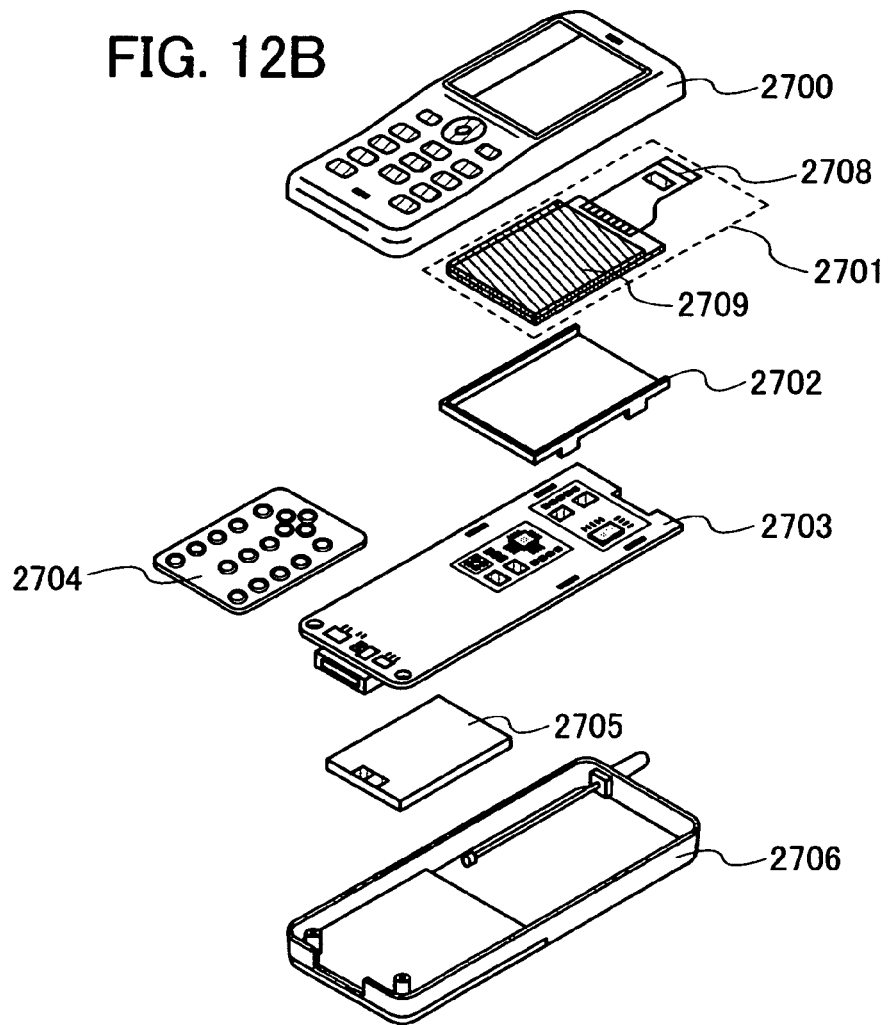

Next, one mode of an electronic appliance to which the semiconductor device of the present invention has been mounted is described with reference to a drawing. The electronic appliance exemplified here is a mobile phone which includes cases 2700 and 2706, a panel 2701, a housing 2702, a printed-wiring board 2703, an operation button 2704, and a battery 2705 (FIG. 12B). The panel 2701 is detachably incorporated in the housing 2702 and the housing 2702 is fitted into the printed-wiring board 2703. The shape and size of the housing 2702 is changed appropriately in accordance with the electronic appliance into which the panel 2701 is incorporated. On the printed-wiring board 2703, a plurality of packaged semiconductor devices is mounted; the semiconductor device of the present invention can be used as one of the packaged semiconductor devices. The plurality of semiconductor devices mounted on the printed-wiring board 2703 have any function selected from a controller, a central processing unit (CPU), a memory, a power supply circuit, an audio processing circuit, a sending/receiving circuit, and the like.

The panel 2701 is connected to the printed-wiring board 2703 via a connection film 2708. The panel 2701, the housing 2702, and the printed-wiring board 2703 are stored together with the operation buttons 2704 and the battery 2705, inside the cases 2700 and 2706. A pixel region 2709 in the panel 2701 is provided so as to be viewed through an opening window provided in the case 2700.

As described above, a semiconductor device of the present invention has characteristics of small and thin size, and lightweight, which makes it possible to efficiently use the limited space inside the cases 2700 and 2706 of the electronic appliance.

Further, since the semiconductor device of the present invention includes a memory element having a simple structure in which an organic compound layer is interposed between a pair of conductive layers, an electronic appliance using an inexpensive semiconductor device can be provided. Moreover, since high-integration is easily realized with the semiconductor device of the present invention, an electronic appliance using a semiconductor device having a memory circuit with large capacity can be provided.

In addition, the memory element included in the semiconductor device of the present invention, to which data is written by electrical action (or both optical action and electrical action), has characteristics of being nonvolatile and capable of additional writing of data. Therefore, it is possible to prevent forgery caused by rewriting and to additionally write new data. Accordingly, an electronic appliance which uses a highly functional and highly value-added semiconductor device can be provided.

Note that the shapes of the cases 2700 and 2706 are just an example of an exterior shape of a mobile phone. The electronic appliance of this embodiment mode can be modified into various modes in accordance with its function and the intended use.

This application is based on Japanese Patent Application serial no. 2005-376626 filed in Japan Patent Office on December, 27, in 2005, the entire contents of which are hereby incorporated by reference.

What is claimed is:

1. A semiconductor device comprising:
   a passive matrix type memory cell array comprising:
   a first conductive layer which extends in a first direction;
   an organic compound layer over the first conductive layer; and
   a second conductive layer over the organic compound layer, wherein the second conductive layer extends in a second direction perpendicularly to the first direction,
   wherein a memory element includes a part of the first conductive layer, a part of the second conductive layer over the part of the first conductive layer, and the organic compound layer interposed between the part of the first conductive layer and the part of the second conductive layer,
   wherein at least one of the first conductive layer and the second conductive layer in the memory element has a top view shape which is bent at least once.

2. The semiconductor device according to claim 1, wherein the top view shape which is bent at least once is a comb-shape.

3. The semiconductor device according to claim 1,
   wherein a rectangle with a same area and a same perimeter as the top view shape which is bent at least once has a ratio of a long side to a short side of 3 or more.

4. The semiconductor device according to claim 1,
   wherein a ratio of an area of the top view shape which is bent at least once to an area of a square with a same perimeter as the top view shape which is bent at least once is 0.75 or less.

5. The semiconductor device according to claim 1, wherein an insulating layer is provided between the first conductive layer and the organic compound layer.

6. A semiconductor device comprising:
   a passive matrix type memory cell array comprising:
   a first conductive layer which extends in a first direction;
   an organic compound layer over the first conductive layer; and
   a second conductive layer over the organic compound layer, wherein the second conductive layer extends in a second direction perpendicularly to the first direction,
   wherein a memory element includes a part of the first conductive layer, a part of the second conductive layer over the part of the first conductive layer, and the organic compound layer interposed between the part of the first conductive layer and the part of the second conductive layer,
   wherein at least one of the first conductive layer and the second conductive layer in the memory element has a top view shape with a slit.

7. The semiconductor device according to claim 6,
   wherein a rectangle with a same area and a same perimeter as the top view shape with the slit has a ratio of a long side to a short side of 3 or more.

8. The semiconductor device according to claim 6,
   wherein a ratio of an area of the top view shape with the slit to an area of a square with a same perimeter as the top view shape with the slit is 0.75 or less.

9. The semiconductor device according to claim 6, wherein an insulating layer is provided between the first conductive layer and the organic compound layer.

10. A semiconductor device comprising:
    a memory element including a first conductive layer, an insulating layer having an opening formed over the first conductive layer, an organic compound layer formed in the opening over the first conductive layer, and a second conductive layer formed over the organic compound layer,
    wherein the opening exposes a part of the first conductive layer, and
    wherein the opening has a top view shape which is bent at least once.

11. The semiconductor device according to claim 10, wherein the top view shape which is bent at least once is a comb-shape.

12. The semiconductor device according to claim 10,
    wherein a rectangle with a same area and a same perimeter as the top view shape which is bent at least once has a ratio of a long side to a short side of 3 or more.

13. The semiconductor device according to claim 10,
    wherein a ratio of an area of the top view shape which is bent at least once to an area of a square with a same perimeter as the top view shape which is bent at least once is 0.75 or less.

14. A semiconductor device comprising:
    a memory element including a first conductive layer, an insulating layer having an opening formed over the first conductive layer, an organic compound layer formed in the opening over the first conductive layer, and a second conductive layer formed over the organic compound layer,
    wherein the opening exposes a part of the first conductive layer, and
    wherein the opening has a top view shape with a slit.

15. The semiconductor device according to claim 14,
    wherein a rectangle with a same area and a same perimeter as the top view shape with the slit has a ratio of a long side to a short side of 3 or more.

16. The semiconductor device according to claim 14,
    wherein a ratio of an area of the top view shape with the slit to an area of a square with a same perimeter as the the top view shape with the slit is 0.75 or less.

* * * * *

UNITED STATES PATENT AND TRADEMARK OFFICE
CERTIFICATE OF CORRECTION

| | |
|---|---|
| PATENT NO. | : 8,212,238 B2 |
| APPLICATION NO. | : 11/635052 |
| DATED | : July 3, 2012 |
| INVENTOR(S) | : Kiyoshi Kato et al. |

It is certified that error appears in the above-identified patent and that said Letters Patent is hereby corrected as shown below:

At column 2, line 32, "S/L" should be --5/L--;

At column 2, line 46, "$(5\mu L)^2$" should be --$(5/L)^2$--;

At column 2, line 59, "31 μm × 3 μm" should be --3 μm × 3 μm--;

At column 7, line 12, "$Y=4\times/(X+1)^2$" should be --$Y=4X/(X+1)^2$--;

At column 10, line 30, "$AlC_3$" should be --$AlCl_3$--;

At column 10, line 48, "$CaI_2$" should be --$CaI_2$--;

At column 11, line 1, "$CO_2(SO_4)_3$" should be --$Co_2(SO_4)_3$--;

At column 32, line 25, "$ClF_3$" should be --$ClF_3$--;

At column 32, line 30, "$ClF_3$" should be --$ClF_3$--;

At column 39, line 32, "RO" should be --R0--;

At column 41, line 39, "RO" should be --R0--.

Signed and Sealed this
Thirteenth Day of November, 2012

David J. Kappos
*Director of the United States Patent and Trademark Office*